US006807034B2

United States Patent
Hasegawa et al.

(10) Patent No.: US 6,807,034 B2
(45) Date of Patent: Oct. 19, 2004

(54) DUAL SPIN-VALVE CCP TYPE THIN-FILM MAGNETIC ELEMENT WITH MULTI FREE LAYERS

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 202 days.

(21) Appl. No.: 10/170,802

(22) Filed: Jun. 13, 2002

(65) Prior Publication Data

US 2002/0191348 A1 Dec. 19, 2002

(30) Foreign Application Priority Data

Jun. 19, 2001 (JP) ........................................ 2001-185244

(51) Int. Cl.$^7$ .............................................. G11B 5/127
(52) U.S. Cl. .................................................. 360/324.2
(58) Field of Search ........................... 360/314, 324.11, 360/324.12, 324.2

(56) References Cited

U.S. PATENT DOCUMENTS

| 5,627,704 A | * | 5/1997 | Lederman et al. | ........... 360/126 |
| 5,668,688 A | * | 9/1997 | Dykes et al. | ............... 360/112 |
| 6,185,079 B1 | * | 2/2001 | Gill | ........................... 360/324.2 |
| 6,249,407 B1 | * | 6/2001 | Aoshima et al. | ......... 360/324.2 |
| 6,275,363 B1 | * | 8/2001 | Gill | ........................... 360/324.2 |

FOREIGN PATENT DOCUMENTS

| JP | 5-275769 | 10/1993 |
| JP | 10-177706 | 6/1998 |
| JP | P2000-349364 A | 12/2000 |
| JP | P2001-15826 A | 1/2001 |
| JP | P2001-160640 A | 6/2001 |
| JP | 2000-286327 | 3/2002 |
| JP | 2000-349106 | 5/2002 |
| JP | 2001-161017 | 12/2002 |

* cited by examiner

*Primary Examiner*—David Davis
(74) *Attorney, Agent, or Firm*—Brinks Hofer Gilson & Lione

(57) ABSTRACT

In a CPP-type magnetic sensing element, a free magnetic layer includes at least two magnetic sublayers and an intermediate sublayer placed between the two adjacent magnetic sublayers, and thus the free magnetic layer is in a synthetic ferrimagnetic state. Since the physical thickness of the free magnetic layer can be increased and the resultant magnetic moment can be decreased, the bulk scattering effect is satisfactorily displayed and the magnetization of the free magnetic layer varies satisfactorily in response to en external magnetic field, resulting in an increase in the read output.

29 Claims, 12 Drawing Sheets

DUAL SPIN-VALVE CCP TYPE THIN-FILM MAGNETIC ELEMENT WITH MULTI FREE LAYERS

BACKGROUND OF THE INVENTION

1. Field of the Invention

The present invention relates to magnetic sensing elements of a current-perpendicular-to-the-plane (CPP) type. More particularly, the invention relates to a magnetic sensing element in which the rate of change in resistance can be improved and a high read-sensitivity and a high output can be obtained, and to a thin-film magnetic head including the magnetic sensing element.

2. Description of the Related Art

FIG. 14 is a partial sectional view which shows the structure of a conventional magnetic sensing element, viewed from the surface facing a recording medium.

In the magnetic sensing element shown in FIG. 14, an antiferromagnetic layer (lower antiferromagnetic layer) 4 composed of a PtMn alloy or the like is formed on an underlayer 6 composed of Ta or the like. A pinned magnetic layer (lower pinned magnetic layer) 3 composed of an NiFe alloy or the like is formed on the antiferromagnetic layer 4, and a nonmagnetic interlayer (lower nonmagnetic interlayer) 2 composed of Cu or the like is formed on the pinned magnetic layer 3. A free magnetic layer 1 composed of an NiFe alloy or the like is formed on the nonmagnetic interlayer 2.

Another nonmagnetic interlayer (upper nonmagnetic interlayer) 2, another pinned magnetic layer (upper pinned magnetic layer) 3, and another antiferromagnetic layer (upper antiferromagnetic layer) 4 are deposited on the free magnetic layer 1 in that order. A protective layer 7 composed of Ta or the like is formed on the upper antiferromagnetic layer 4.

The layers from the underlayer 6 to the protective layer 7 together constitute a multilayer film 10. Hard bias layers 5 are formed on both sides in the track width direction (in the X direction in the drawing) of the multilayer film 10, and electrode layers 11 are formed on the hard bias layers 5.

This magnetic sensing element is a so-called "dual spin-valve thin-film element" in which the pinned magnetic layer 3 and the antiferromagnetic layer 4 are disposed on each surface of the free magnetic layer 1 with the nonmagnetic interlayer 2 therebetween.

In the magnetic sensing element shown in FIG. 14, the magnetization direction of the pinned magnetic layer 3 is pinned in the height direction (in the Y direction in the drawing) by an exchange coupling magnetic field generated between the pinned magnetic layer 3 and the antiferromagnetic layer 4. The magnetization direction of the free magnetic layer 1 is aligned in the track width direction (in the X direction) by a longitudinal bias magnetic field from the hard bias layer 5.

In the dual spin-valve thin-film element shown in FIG. 14, since the number of interfaces at which electron scattering occurs is twice as many as a single spin-valve thin-film element which includes an antiferromagnetic layer, a pinned magnetic layer, a nonmagnetic interlayer, and free magnetic layer, each one layer, an improvement in the rate of change in resistance is expected.

In the magnetic sensing element shown in FIG. 14, a sensing current flows substantially parallel to the planes of the individual layers of the multilayer film 10, that is, the element is referred to as a "current-in-the-plane (CIP)" type element.

On the other hand, an element in which a sensing current flows perpendicular to the individual layers of the multilayer film 10 is referred to as a "current-perpendicular-to-the-plane (CPP)" type element.

When the element is miniaturized as the recording density is increased, and in particular, when the area of an element in the direction parallel to the planes of the individual layers is decreased to 0.1 $\mu$m square or less, it is known that the read output can be increased by selecting the CPP type instead of the CIP type.

Therefore, in order to improve both the read output and the rate of change in resistance as the recording density is further increased in future, a magnetic sensing element of a CPP type having a dual structure is thought to be desirable.

FIG. 15 is a schematic diagram showing a structure of a CPP-type dual spin-valve thin-film element.

The giant magnetoresistance (GMR) effect in a magnetic sensing element is mainly caused by "spin-dependent scattering" of electrons. That is, the GMR effect is obtained by using the difference between the mean free path $\lambda^+$ of the conduction electrons (e.g., spin-up electrons) having a spin parallel to the magnetization direction of a magnetic material, i.e., herein, a free magnetic layer, and the mean free path $\lambda^-$ of the conduction electrons (e.g., spin-down electrons) having a spin antiparallel to the magnetization direction of the free magnetic layer.

In the CPP-type magnetic sensing element, since the current flows perpendicular to the planes of the individual layers, the length of the current path of the sensing current flowing through a free magnetic layer, a nonmagnetic interlayer, and a pinned magnetic layer, which participate in the magnetoresistance effect, is shorter compared to the CIP-type magnetic sensing element in which the sensing current flows substantially parallel to the planes of the individual layers.

Therefore, if the thickness of the pinned magnetic layer and the thickness of the free magnetic layer are small, the conduction electrons, for example, spin-down electrons, which are not supposed to pass through the magnetic layers in the CIP type, pass through the magnetic layers together with the spin-up conduction electrons in the CPP type. It is not possible to increase the difference between the mean free path $\lambda^+$ of the spin-up conduction electrons and the mean free path $\lambda^-$ of the spin-down conduction electrons, and the rate of change in resistance cannot be improved.

Although an attempt has been made to improve the rate of change in resistance by increasing the thickness of the pinned magnetic layer and the thickness of the free magnetic layer so that the bulk scattering effect is satisfactorily displayed, if the thickness of the free magnetic layer is increased, variations in the magnetization of the free magnetic layer in response to an external magnetic field become dull because of an increase in the magnetic moment.

The magnetic moment of the free magnetic layer is determined by the product of the saturation magnetization Ms and the thickness t1. The magnetic moment is an index of variability of the magnetization of the magnetic layer in response to an external magnetic field. That is, if the magnetic moment is increased, variability of the magnetization of the magnetic layer having the magnetic moment in response to the external magnetic field is weakened.

In the magnetic sensing element, the magnetization of the pinned magnetic layer is pinned in a predetermined direction and the magnetization of the free magnetic layer varies in response to an external magnetic field, resulting in a change in the electrical resistance, and thereby external signals are detected. Therefore, the magnetization of the free magnetic layer must vary with the external magnetic field sensitively. In the CPP type, however, if the thickness of the free magnetic layer is increased to display the bulk scattering effect, the magnetic moment of the free magnetic layer is increased, and as a result, the sensitivity to the external magnetic field is decreased and it is not possible to improve the read output appropriately.

As described above, in the conventional CPP-type magnetic sensing element, it is not possible to improve both the read output and the rate of change in resistance simultaneously.

With respect to the CPP-type dual spin-valve thin-film element, since the number of layers can be increased and the number of the interfaces at which electron scattering occurs is increased compared to the single spin-valve thin-film element, an improvement in the rate of change in resistance is expected. However, a further improvement in the rate of change in resistance is desired to meet the demands for higher recording densities.

SUMMARY OF THE INVENTION

It is an object of the present invention to provide a CPP-type magnetic sensing element in which the rate of change in resistance can be improved and an excellent read-sensitivity and a high output can be obtained.

It is another object of the present invention to provide a thin-film magnetic head in which the gap of the MR head can be narrowed even if the total thickness of the magnetic sensing element is increased and which is suitable for a future increase in the recording densities.

In one aspect of the present invention, a magnetic sensing element includes a multilayer film including a free magnetic layer, an upper nonmagnetic interlayer placed on the free magnetic layer, a lower nonmagnetic interlayer placed under the free magnetic layer, an upper pinned magnetic layer placed on the upper nonmagnetic interlayer, a lower pinned magnetic layer placed under the lower nonmagnetic interlayer, an upper antiferromagnetic layer placed on the upper pinned magnetic layer, the upper antiferromagnetic layer pinning the magnetization direction of the upper pinned magnetic layer in a predetermined direction by an exchange coupling magnetic field, and a lower antiferromagnetic layer placed under the lower pinned magnetic layer, the lower antiferromagnetic layer pinning the magnetization direction of the lower pinned magnetic layer in a predetermined direction by an exchange coupling magnetic field, wherein a current flows perpendicular to the planes of the individual layers of the multilayer film, and the free magnetic layer includes at least two magnetic sublayers and an intermediate sublayer placed between the two adjacent magnetic sublayers.

The magnetic sensing element of the present invention is a CPP-type dual spin-valve thin-film element in which a sensing current flows perpendicular to the planes of the individual layers of the multilayer film.

In the present invention, in order to increase the physical thickness and to decrease the resultant magnetic moment of the free magnetic layer by decreasing the magnetic thickness, the free magnetic layer is formed to as to include at least two magnetic sublayers and the intermediate sublayer placed between the two adjacent magnetic sublayers. That is, the individual magnetic sublayers constituting the free magnetic layer are magnetized antiparallel to the magnetization direction of the opposed magnetic sublayers, and thus the free magnetic layer has a ferrimagnetic structure.

In the CPP-type magnetic sensing element having such a structure, by increasing the thicknesses of the magnetic sublayers, it is possible to display the bulk scattering effect satisfactorily, resulting in an improvement in the rate of change in resistance, and it is also possible to decrease the resultant magnetic moment which is the vector sum of the magnetic moments of all the magnetic sublayers. Consequently, the magnetization of the free magnetic layer varies satisfactorily in response to an external magnetic field, and it is possible to improve the read output.

As will be described in detail with reference to the drawings, with respect to a CPP-type dual spin-valve thin-film element having a free magnetic layer with the ferrimagnetic structure as is the case of the present invention, an equivalent circuit representing spots which display the magnetoresistance effect due to a change in electrical resistance is a series circuit.

On the other hand, with respect to a CIP-type dual spin-valve thin-film element having a free magnetic layer with the ferrimagnetic structure, an equivalent circuit representing spots which display the magnetoresistance effect due to a change in electrical resistance is a parallel circuit.

Therefore, it is possible to manufacture a magnetic sensing element having a higher rate of change in resistance effectively by using the CPP-type dual spin-valve thin-film element compared to the CIP-type dual spin-valve thin-film element.

In another aspect of the present invention, a magnetic sensing element includes at least two multilayer films, each including a free magnetic layer, an upper nonmagnetic interlayer placed on the free magnetic layer, a lower nonmagnetic interlayer placed under the free magnetic layer, an upper pinned magnetic layer placed on the upper nonmagnetic interlayer, and a lower pinned magnetic layer placed under the lower nonmagnetic interlayer; an intermediate antiferromagnetic layer placed between the two adjacent multilayer films; a lower antiferromagnetic layer placed under the lower surface of the multilayer film located at the bottom of the element; and an upper antiferromagnetic layer placed on the upper surface of the multilayer film located on the top of the element, wherein the magnetization direction of each of the upper pinned magnetic layer and the lower pinned magnetic layer is pinned in a predetermined direction by an exchange coupling magnetic field generated between the pinned magnetic layer and any one of the antiferromagnetic layers, and a current flows perpendicular to the planes of the individual layers.

In the magnetic sensing element of the present invention having the configuration described above, at least two free magnetic layers are provided. In the dual spin-valve thin-film element described above, one free magnetic layer is provided. By providing at least two free magnetic layers, the number of interfaces at which electron scattering occurs can be further increased, and it is possible to manufacture a magnetic sensing element in which the rate of change in resistance can be more effectively improved compared to the configuration of the dual spin-valve thin-film element.

Preferably, the free magnetic layer includes at least two magnetic sublayers and an intermediate sublayer placed between the two adjacent magnetic sublayers. Consequently, the free magnetic layer can have a ferrimagnetic structure. Since the physical thickness of the free magnetic layer can be increased and the magnetic thickness can be decreased, the rate of change in resistance can be further improved and the read output can be further improved.

In the present invention, preferably, the thickness of the magnetic sublayer adjoining the nonmagnetic interlayer is in the range of 40 Å to 100 Å. Consequently, the bulk scattering effect can be satisfactorily displayed and the rate of change in resistance can be further improved.

In the present invention, when the number of magnetic sublayers is two, the total thickness of the magnetic sublayers is preferably in the range of 85 Å to 195 Å. Consequently, the physical thickness of the free magnetic layer can be increased, and the rate of change in resistance can be further improved.

In the present invention, when the number of magnetic sublayers is two, the resultant magnetic moment (saturation magnetization Ms×thickness t) of the free magnetic layer is preferably in the range of 5 T·Å to 60 T·Å. Consequently, the magnetic thickness of the free magnetic layer can be decreased, and it is possible to obtain a magnetic sensing element in which the magnetization varies sensitively in response to an external magnetic field and the read output is increased.

More preferably, the resultant magnetic moment is 30 T·Å or less.

In the present invention, preferably, three magnetic sublayers constitute the free magnetic layer, and the magnetic sublayer in contact with the upper nonmagnetic interlayer and the magnetic sublayer in contact with the lower nonmagnetic interlayer are magnetized in the same direction. In such a magnetization state, manufacturing of the magnetic sensing element is facilitated.

In such a case, the total thickness of the magnetic sublayers is preferably 85 Å to 295 Å, and the resultant magnetic moment (saturation magnetization Ms×thickness t) of the free magnetic layer is preferably 45 T·Å to 195 T·Å. Consequently, the physical thickness of the free magnetic layer can be increased, and the rate of change in resistance can be further increased. The magnetic thickness of the free magnetic layer can be decreased, and it is possible to obtain a magnetic sensing element in which the magnetization varies sensitively in response to an external magnetic field and the read output is increased.

In the present invention, preferably, the pinned magnetic layer includes two magnetic sublayers and an intermediate sublayer placed between the magnetic sublayers. Thus, the pinned magnetic layer has a so-called ferrimagnetic structure. Consequently, the physical thickness of the pinned magnetic layer can be increased, and the apparent magnitude of an exchange coupling magnetic field generated between the pinned magnetic layer and the antiferromagnetic layer can be increased. As a result, the rate of change in resistance can be improved and the magnetization of the pinned magnetic layer can be appropriately pinned.

In the present invention, preferably, the magnetic sensing element recedes from a surface facing a recording medium in the height direction, a flux guide layer extends from the front end of the free magnetic layer to the surface facing the recording medium, the flux guide layer being integrally formed with the free magnetic layer or being magnetically coupled to the free magnetic layer, and the flux guide layer is exposed at the surface facing the recording medium.

Preferably, the width in the track width direction of the flux guide layer at the surface facing the recording medium is smaller than the width in the track width direction of the free magnetic layer.

In another aspect of the present invention, a thin-film magnetic head of the present invention includes the magnetic sensing element described above, and upper and lower shielding layers provided on and under the flux guide layer with gap layers therebetween.

As described above, in the thin-film magnetic head of the present invention, the magnetic sensing element recedes in the height direction from the surface facing the recording medium, and the front end of the flux guide layer is exposed at the surface facing the recording medium. When an external magnetic field is introduced from the flux guide layer, the magnetization direction of the free magnetic layer magnetically coupled to the flux guide layer is varied, thus displaying the GMR effect.

In the present invention, since the shielding layers are provided on and under the flux guide layer with the gap layers therebetween, the gap can be narrowed appropriately, and it is possible to manufacture a thin-film magnetic head which is suitable for the future increase in the recording densities.

The thin-film magnetic head of the present invention, preferably includes a back yoke layer provided on the surface opposite to the surface facing the recording medium, the back yoke layer being integrally formed with the free magnetic layer or being magnetically coupled to the free magnetic layer, and a base of the shielding layer located above the flux guide layer may be magnetically coupled to the back yoke layer.

In such a configuration, an inductive head for writing can be formed using the flux guide layer, the free magnetic layer, the back yoke layer, and the upper shielding layer.

That is, in the present invention, gap narrowing can be achieved, and the MR head for reading and the inductive head for writing can be formed with a small number of layers, thus facilitating the manufacturing process.

DESCRIPTION OF THE PREFERRED EMBODIMENTS

Figure 1:
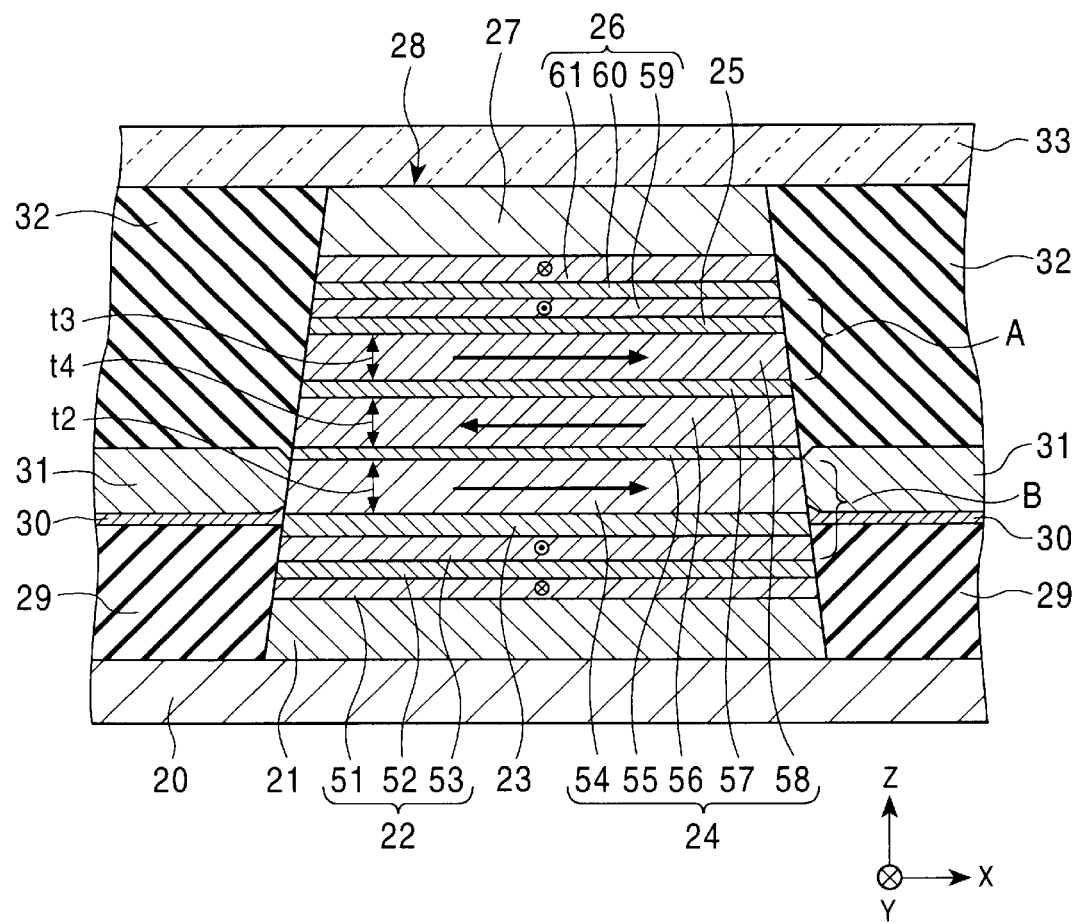
FIG. 1 is a partial sectional view of a magnetic sensing element in a first embodiment of the present invention, viewed from the surface facing a recording medium.

FIG. 1 is a partial sectional view of a magnetic sensing element (dual spin-valve thin-film element) in a first embodiment of the present invention, viewed from the surface facing a recording medium. FIG. 1 shows only the central section of the element extending in the X direction.

Shielding layers (not shown in the drawing) are provided on the upper and lower surfaces of the magnetic sensing element shown in FIG. 1 with gap layers (not shown in the drawing) therebetween. The magnetic sensing element, the gap layers, and the shielding layers constitute a MR head. The MR head reads external signals recorded in the recording medium. In the present invention, an inductive head for writing may be deposited on the MR head. The shielding layer (upper shielding layer) formed on the upper surface of the magnetic sensing element may also act as a lower core layer of the inductive head.

The MR head is formed on the trailing end of a slider composed of, for example, alumina-titanium carbide ($Al_2O_3$—TiC). The slider is joined to an elastically deformable support composed of stainless steel or the like at the surface opposite to the surface facing the recording medium, and a magnetic head apparatus is thus constructed.

A first electrode layer 20 is composed of, for example, α-Ta, Au, Cr, Cu, or W.

A lower antiferromagnetic layer 21 is formed on the upper surface of the center of the first electrode layer 20. The lower antiferromagnetic layer 21 is preferably composed of an antiferromagnetic material containing an element X and Mn, wherein X is at least one element selected from the group consisting of Pt, Pd, Ir, Rh, Ru, and Os. Alternatively, the lower antiferromagnetic layer 21 is preferably composed of an antiferromagnetic material containing the element X, an element X', and Mn, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

These antiferromagnetic materials have excellent corrosion resistance and high blocking temperatures and can generate a large exchange coupling magnetic field at the interface with a lower pinned magnetic layer 22 which will be described below. Preferably, the lower antiferromagnetic layer 21 has a thickness of 50 Å to 250 Å.

An underlayer composed of Ta or the like and a seed layer composed of an NiFe alloy or the like may be formed between the first electrode layer 20 and the lower antiferromagnetic layer 21. The seed layer is mainly composed of face-centered cubic crystals, and the (111) plane is preferentially oriented parallel to the interface with the lower antiferromagnetic layer 21. The seed layer may be composed of an Ni—Fe—Y alloy instead of an NiFe alloy, wherein Y is at least one element selected from the group consisting of Cr, Rh, Ta, Hf, Nb, Zr, and Ti. When the seed layer composed of such a material is formed on the underlayer composed of Ta or the like, the (111) plane is easily preferentially oriented parallel to the interface with the lower antiferromagnetic layer 21. The seed layer has a thickness of, for example, approximately 30 Å.

Since the magnetic sensing element of the present invention is of the CPP type in which a sensing current flows perpendicular to the planes of the individual layers, the sensing current must also flow through the seed layer appropriately. Therefore, preferably, the seed layer does not have a high resistivity. That is, in the CPP type, the seed layer is preferably composed of a material having a low resistivity, such as an NiFe alloy.

The lower pinned magnetic layer 22 is formed on the lower antiferromagnetic layer 21. In this embodiment, the lower pinned magnetic layer 22 has a three-layered structure.

Magnetic sublayers 51 and 53 constituting the lower pinned magnetic layer 22 are composed of Co, a CoFe alloy, a CoFeNi alloy, an NiFe alloy, or the like. An intermediate sublayer 52 composed of a nonmagnetic conductive material, and more specifically, at least one element selected from the group consisting of Ru, Rh, Ir, Cr, Re, and Cu, is placed between the magnetic sublayers 51 and 53. By such a construction, the magnetization directions of the magnetic sublayers 51 and 53 are set to be in an antiparallel state, which is a so-called "ferrimagnetic state".

An exchange coupling magnetic field is generated by annealing in a magnetic field between the lower antiferromagnetic layer 21 and the magnetic sublayer 51 of the lower pinned magnetic layer 22. For example, when the magnetization of the magnetic sublayer 51 is pinned in the height direction (in the Y direction in the drawing), the magnetization of the other magnetic sublayer 53 is pinned in a direction opposite to the height direction by the RKKY interaction. By such a construction, the magnetization of the lower pinned magnetic layer 22 can be stabilized, and the exchange coupling magnetic field generated at the interface between the lower pinned magnetic layer 22 and the lower antiferromagnetic layer 21 can be increased apparently.

For example, each of the magnetic sublayers 51 and 53 has a thickness of approximately 10 Å to 70 Å. The intermediate sublayer 52 has a thickness of approximately 3 Å to 10 Å.

The magnetic sublayers 51 and 53 are composed of different materials or have different thicknesses so as to have different magnetic moments. The magnetic moment is the product of the product of the saturation magnetization Ms and the thickness t. For example, when the magnetic sublayers 51 and 53 are composed of the same material with the same composition, by forming the magnetic sublayers 51 and 53 with different thicknesses, the magnetic sublayers 51 and 53 have different magnetic moments. Thereby, the magnetic sublayers 51 and 53 can be formed appropriately so as to have a ferrimagnetic structure.

Additionally, in the present invention, instead of the ferrimagnetic structure, the lower pinned magnetic layer 22 may be a single layer or laminated layer composed of an NiFe alloy, a CoFeNi alloy, a CoFe alloy, Co, or the like.

A lower nonmagnetic interlayer 23 is formed on the lower pinned magnetic layer 22. The lower nonmagnetic interlayer 23 is composed of a conductive material having a low electrical resistance, such as Cu. The lower nonmagnetic interlayer 23 has a thickness of, for example, approximately 25 Å.

A free magnetic layer 24 is formed on the nonmagnetic interlayer 23. In the embodiment shown in FIG. 1, the free magnetic layer 24 has a five-layered structure.

The free magnetic layer 24 includes magnetic sublayers 54, 56, and 58 composed of an NiFe alloy, a CoFeNi alloy, a CoFe alloy, Co, or the like. Intermediate sublayers 55 and 57 are formed between the magnetic sublayers 54 and 56 and between the magnetic sublayers 56 and 58, respectively. The intermediate sublayers 55 and 57 are preferably composed of a nonmagnetic conductive material, and specifically, at least one element selected from the group consisting of Ru, Rh, Ir, Cr, Re, and Cu.

In this embodiment, the free magnetic layer 24 has a ferrimagnetic structure in which the magnetic sublayers and the intermediate sublayers are alternately deposited. As shown in FIG. 1, when the magnetic sublayer 54 formed at the lowest level is magnetized in the X direction, the magnetic sublayer 56 formed thereon is magnetized in a direction opposite to the X direction. The magnetic sublayer 58 formed at the highest level is magnetized in the X direction.

As shown in FIG. 1, an upper nonmagnetic interlayer 25 is formed on the free magnetic layer 24. The upper nonmagnetic interlayer 25 is composed of Cu or the like, the same as the lower nonmagnetic interlayer 23.

An upper pinned magnetic layer 26 is formed on the upper nonmagnetic interlayer 25. The upper pinned magnetic layer 26 has a ferrimagnetic structure, the same as the lower pinned magnetic layer 22.

The upper pinned magnetic layer 26 includes magnetic sublayers 59 and 61 and an intermediate sublayer 60. The magnetic sublayers 59 and 61 are composed of an NiFe alloy, a CoFeNi alloy, a CoFe alloy, Co, or the like. The intermediate sublayer 60 is composed of a nonmagnetic conductive material, and more specifically, at least one element selected from the group consisting of Ru, Rh, Ir, Cr, Re, and Cu.

In this embodiment, in the upper pinned magnetic layer 26, the magnetic sublayer 59 facing the upper nonmagnetic interlayer 25 is magnetized in a direction opposite to the height direction, and the magnetic sublayer 61 is magnetized in the height direction. Thus, the magnetizations of the magnetic sublayers 59 and 61 are antiparallel.

An upper antiferromagnetic layer 27 is formed on the upper pinned magnetic layer 26. The upper antiferromagnetic layer 27 is preferably composed of an antiferromagnetic material containing an element X and Mn, wherein X is at least one element selected from the group consisting of Pt, Pd, Ir, Rh, Ru, and Os, the same as the lower antiferromagnetic layer 21. Alternatively, the upper antiferromagnetic layer 27 is preferably composed of an antiferromagnetic material containing the element X, an element X', and Mn, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

In this embodiment, an exchange coupling magnetic field is produced between the upper antiferromagnetic layer 27 and the magnetic sublayer 61, which faces the upper antiferromagnetic layer 27, of the upper pinned magnetic layer 26, and thereby the magnetization of the magnetic sublayer 61 is pinned in the height direction (in the Y direction). The magnetization of the magnetic sublayer 59 of the upper pinned magnetic layer 26 is pinned in a direction opposite to the height direction by the RKKY interaction with the magnetic sublayer 61.

The magnetic sublayers 59 and 61 of the upper pinned magnetic layer 26 are formed so as to have different magnetic moments (saturation magnetization Ms×thickness t) by selecting different materials or different thicknesses, as are the magnetic sublayers 51 and 53 of the lower pinned magnetic layer 22.

In the embodiment shown in FIG. 1, the individual layers from the lower antiferromagnetic layer 21 to the upper antiferromagnetic layer 27 constitute a multilayer film 28.

As shown in FIG. 1, at both sides in the track width direction (in the X direction) of the multilayer film 28, insulating layers 29 composed of $Al_2O_3$, $SiO_2$, or the like are formed on the first electrode layer 20. In this embodiment, the upper surface of the insulating layer 29 is located lower than the lower surface of the magnetic sublayer 54 of the free magnetic layer 24.

Bias underlayers 30 are formed on the insulating layers 29. Hard bias layers 31 are formed on the bias underlayers 30.

The bias underlayer 30 is preferably composed of a metal film having a body-centered cubic (bcc) crystal structure. In such a case, the (110) plane of the bias underlayer 30 is preferentially oriented.

The hard bias layer 31 is composed of a CoPt alloy, a CoPtCr alloy, or the like. The crystal structure of these alloys has a mixed phase of a face-centered cubic (fcc) structure and a hexagonal close-packed (hcp) structure.

Since the lattice constant of the bias underlayer 30 composed of the metal film and the lattice constant of the CoPt-based alloy constituting the hard bias layer 31 are close, the CoPt-based alloy tends to have the hcp structure rather than the fcc structure. In such a case, the c-axis of the hcp structure is preferentially oriented in the interfacial boundary of the CoPt-based alloy. Since the hcp structure exhibits stronger magnetic anisotropy in the c-axis direction compared to the fcc structure, the coercive force Hc is increased when a magnetic field is applied to the hard bias layer 31. Moreover, since the c-axis of the hcp structure is preferentially oriented in the interfacial boundary between the CoPt-based alloy and the bias underlayer 30, the residual magnetization is increased and the remanence ratio S determined by residual magnetization/saturation magnetic flux density is increased. As a result, it is possible to improve the characteristics of the hard bias layer 31, and the magnitude of the bias magnetic field from the hard bias layer 31 can be increased.

In the present invention, the metal film having the body-centered cubic (bcc) crystal structure is preferably composed of at least one element selected from the group consisting of Cr, W, Mo, V, Mn, Nb, and Ta. In the present invention, the bias underlayers 30 may be omitted.

In this embodiment, the upper surface of the hard bias layer 31 is located lower than the lower surface of the magnetic sublayer 56 which is placed in the middle of the free magnetic layer 24. That is, the longitudinal bias magnetic field from the hard bias layer 31 is applied only to the magnetic sublayer 54 which is placed at the bottom of the free magnetic layer 24.

In the embodiment shown in FIG. 1, insulating layers 32 composed of $Al_2O_3$, $SiO_2$, or the like are formed on the hard bias layers 31.

In this embodiment, although the upper surface of the insulating layer 32 is flush with the upper surface of the upper antiferromagnetic layer 27, this configuration is not always required.

A second electrode layer 33 is formed over the insulating layers 32 and the upper antiferromagnetic layer 27. The second electrode layer 33 is composed of, for example, α-Ta, Au, Cr, Cu, or W, the same as the first electrode layer 20.

The features in this embodiment will be described below. The electrode layers 33 and 20 are formed on the upper and lower sides of the multilayer film 28, and a sensing current from one of the electrode layers 20 and 33 flows perpendicular to the planes of the individual layers of the multilayer film 28. Such a direction of current flow is referred to as a CPP type.

As shown in FIG. 1, the magnetic sensing element has a film structure referred to as a dual spin-valve thin-film element in which a pinned magnetic layer, a nonmagnetic interlayer, and an antiferromagnetic layer, each one layer, are provided on the upper and lower surfaces of the free magnetic layer 24.

The free magnetic layer 24 includes the magnetic sublayers 54, 56, and 58 and the intermediate sublayers 55 and 57 placed between the two adjacent magnetic sublayers, and each of the magnetic sublayers 54, 56, and 58 is magnetized antiparallel to the magnetization direction of the adjacent magnetic sublayer, thus forming a ferrimagnetic structure. In this embodiment, the longitudinal magnetic field from the hard bias layer 31 is applied to the magnetic sublayer 54 of the free magnetic layer 24 and the magnetic sublayer 54 is magnetized in the X direction. The magnetic sublayer 56 is magnetized in a direction opposite to the X direction by the RKKY interaction with the magnetic sublayer 54. The magnetic sublayer 58 is magnetized in the X direction by the RKKY interaction with the magnetic sublayer 56.

Consequently, even if the thickness of each of the magnetic sublayers 54, 56, and 58 is increased, the resultant magnetic moment which is the vector sum of the magnetic moments of the magnetic sublayers 54, 56, and 58 can be decreased compared to a case in which the free magnetic layer 24 is formed as a single layer having a thickness corresponding to the total thickness of the magnetic sublayers 54, 56, and 58.

As described above, the magnetic moment is determined by the product of the saturation magnetization Ms and the thickness t. If the thickness t is increased, the magnetic moment is increased. However, in the ferrimagnetic structure, since the two adjacent magnetic sublayers are magnetized antiparallel to each other, the magnetic moments of the two adjacent magnetic sublayers counteract each other. Therefore, in the ferrimagnetic structure, it is possible to decrease the resultant magnetic moment of the magnetic moments of all of the magnetic sublayers 54, 56, and 58.

Even if the physical thickness of the free magnetic layer 24 is increased by increasing the thickness of each of the magnetic sublayers 54, 56, and 58, the magnetic thickness can be decreased because the resultant magnetic moment is decreased. Therefore, the bulk scattering effect can be displayed satisfactorily, and the rate of change in resistance can be improved. It is also possible to reverse the magnetization of the free magnetic layer 24 sensitively in response to an external magnetic field, resulting in an improvement in the read output.

The thickness of the free magnetic layer 24 will now be described. In the present invention, each of the thickness t2 of the magnetic sublayer 54 in contact with the nonmagnetic interlayer 23 and the thickness t3 of the magnetic sublayer 58 in contact with the nonmagnetic interlayer 25 is preferably in the range of 40 Å to 100 Å.

When the free magnetic layer 24 has the ferrimagnetic structure as shown in FIG. 1, the magnetic sublayers participating in the magnetoresistance effect are the magnetic sublayer 54 in contact with the nonmagnetic interlayer 23 and the magnetic sublayer 58 in contact with the nonmagnetic interlayer 25.

Therefore, preferably, the bulk scattering effect is displayed satisfactorily in the magnetic sublayers 54 and 58.

For that purpose, the magnetic sublayers 54 and 58 must have a thickness which allows the bulk scattering effect to be displayed satisfactorily. The lower limit of the thickness for this is 40 Å. If the thickness exceeds 100 Å, in order to decrease the resultant magnetic moment, the thickness of the magnetic sublayer 56 placed in the middle must also be increased, and as a result, the total thickness of the multilayer film 28 is increased, and it is not possible to manufacture the magnetic sensing element easily and appropriately.

In the present invention, the total thickness of the magnetic sublayer 54, the magnetic sublayer 56, and the magnetic sublayer 58 constituting the free magnetic layer 24 ia preferably 85 Å to 295 Å. For example, the thickness of each of the magnetic sublayer 54 and the magnetic sublayer 58 may be set at 40 Å, and the thickness of the magnetic sublayer 56 may be set at 5 Å (total thickness 85 Å). In another example, the thickness of each of the magnetic sublayer 54 and the magnetic sublayer 58 may be set at 100 Å, and the thickness of the magnetic sublayer 56 may be set at 95 Å (total thickness 295 Å).

Consequently, since the physical thickness of the free magnetic layer 24 can be increased, the bulk scattering effect can be satisfactorily displayed, and the rate of change in resistance can be improved appropriately. If the total thickness is within the range described above, the free magnetic layer 24 can be formed easily.

In the present invention, the resultant magnetic moment (saturation magnetization Ms×thickness t) of the free magnetic layer 24 is preferably 45 T·Å to 195 T·Å.

In the embodiment shown in FIG. 1, the vector sum of the magnetic moments of the magnetic sublayers 54, 56, and 58 corresponds to the resultant magnetic moment. In order to set the resultant magnetic moment within the range described above, the material and thickness for the magnetic sublayers 54, 56, and 58 must be appropriately adjusted.

If the free magnetic layer 24 has the resultant magnetic moment described above, the magnetization of the free magnetic layer 24 can be varied sensitively in response to an external magnetic field and the read output can be improved appropriately.

Next, when the free magnetic layer 24 has a ferrimagnetic structure, the CPP type is superior to the CIP structure. The reason for this will be described below.

When the free magnetic layer 24 has the ferrimagnetic structure, conduction electrons easily scatter at the interfaces between the magnetic sublayers 54, 56, 58 and the intermediate sublayers 55 and 57. Such a phenomenon occurs both in the CPP-type structure and in the CIP-type structure. When a sensing current is applied parallel to the planes of the individual layers as in the case of the CIP-type structure, each of the amount of change in resistance (ΔR) in the three-layered portion A including the magnetic sublayer 59 of the upper pinned magnetic layer 26, the upper nonmagnetic interlayer 25, and the magnetic sublayer 58 of the free magnetic layer 24 and the amount of change in resistance (ΔR) in the three-layered portion B including the magnetic sublayer 53 of the lower pinned magnetic layer 22, the lower nonmagnetic interlayer 23, and the magnetic sublayer 54 of the free magnetic layer 24, which participates in the magnetoresistance effect, corresponds to the sum of parallel connection.

Figure 2:
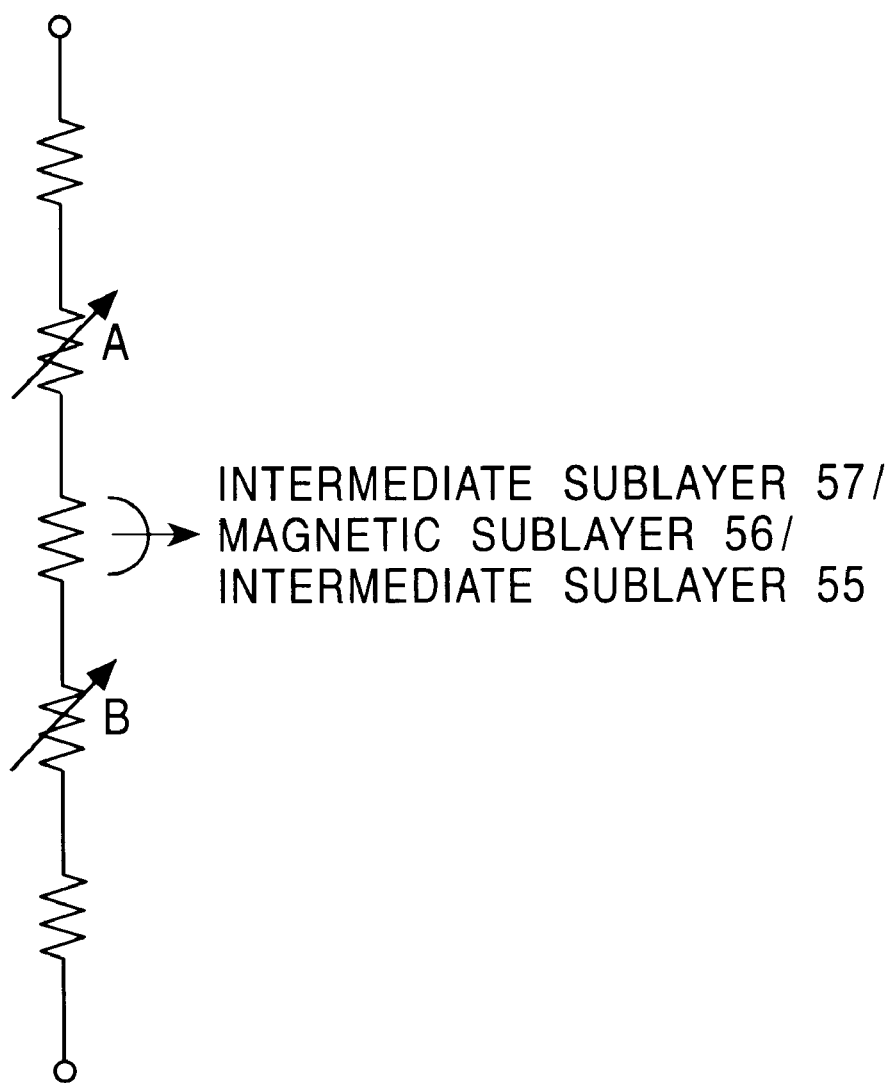
FIG. 2 is an electrical diagram showing the spot at which a change in resistance of the magnetic sensing element shown in FIG. 1 occurs in the form of an equivalent circuit.

On the other hand, in the CPP-type structure in which a sensing current is applied perpendicular to the planes of the individual layers, each of the amount of change in resistance (ΔR) in the three-layered portion A including the magnetic sublayer 59 of the upper pinned magnetic layer 26, the upper nonmagnetic interlayer 25, and the magnetic sublayer 58 of the free magnetic layer 24 and the amount of change in resistance (ΔR) in the three-layered portion B including the magnetic sublayer 53 of the lower pinned magnetic layer 22, the lower nonmagnetic interlayer 23, and the magnetic sublayer 54 of the free magnetic layer 24, which participates in the magnetoresistance effect, corresponds to the sum of series connection as shown in FIG. 2.

Therefore, when the free magnetic layer 24 has the ferrimagnetic structure, the CPP-type dual spin-valve thin-film element can have a larger rate of change in resistance (ΔGMR) compared to the CIP-type dual spin-valve thin-film element.

Next, more preferred examples of the free magnetic layer 24 will be described. Preferably, the magnetic sublayers 54 and 58 in contact with the nonmagnetic interlayers 23 and 25, respectively, have a two-layered structure including a Co portion on the side in contact with the nonmagnetic interlayer 23 or 25. Consequently, diffusion of metallic elements, etc. can be prevented at the interfaces with the nonmagnetic interlayers 23 and 25, and the rate of change in resistance (ΔGMR) can be increased. The portions other than the Co portions in the magnetic sublayers 54 and 58 are composed of a magnetic material, such as an NiFe alloy, a CoFe alloy, or a CoFeNi alloy.

In the present invention, when the magnetic sublayers and parts of the magnetic sublayers constituting the free magnetic layer 24 are composed of a CoFeNi alloy, the compositional ratio is preferably $Co_{95}$ to $_{75}Fe_{15}$ to $_5Ni_{10}$ to $_0$. Consequently, the soft magnetic properties of the free magnetic layer 24 can be improved. Specifically, the coercive force Hc can be decreased, the crystal magnetic anisotropy energy K of the free magnetic layer 24 which is proportional to the coercive force Hc can be decreased, and the magnetization of the free magnetic layer 24 can be rotated satisfactorily in response to an external magnetic field.

The positional relationship between the free magnetic layer 24 and the hard bias layers 31 will now be described below. In this embodiment, the hard bias layers 31 are formed only on both sides of the magnetic sublayer 54 which is placed at the bottom in the free magnetic layer 24.

Consequently, only the magnetic sublayer 54 can receive the longitudinal bias magnetic field from the hard bias layer 31, and the magnetic sublayer 54 is magnetized in the track width direction. The other magnetic sublayers 56 and 58 are magnetized antiparallel to each other by the RKKY interactions.

The hard bias layers 31 may be formed so as to face both sides of the magnetic sublayers 56 and 58 in addition to the both sides of the magnetic sublayer 54. When the hard bias layers 31 are formed on both sides of two or more magnetic sublayers, the magnetic sublayers facing the hard bias layer 31 must have different magnetic moments. In such a case, if the magnetic sublayer having a larger magnetic moment is magnetized in the track width direction under the strong influence of the longitudinal bias magnetic field from the hard bias layer 31, the magnetic sublayer having a smaller magnetic moment is magnetized in a direction opposite to the track width direction by the RKKY interaction generated at the interface with the magnetic sublayer having the larger magnetic moment, and thereby, it is possible to secure an appropriate ferrimagnetic structure having a small amount of magnetic scattering.

Additionally, the positions at which the hard bias layers 31 are formed are not limited to those shown in FIG. 1. For example, the hard bias layers 31 may be provided only on both sides of the upper magnetic sublayer 58 in the free magnetic layer 24, or may be provided only on both sides of the magnetic sublayer 56 placed in the middle of the free magnetic layer 24.

Alternatively, the hard bias layers 31 may be provided on both sides of the upper magnetic sublayer 58 and the lower magnetic sublayer 54 excluding the middle magnetic sublayer 56. In such a configuration, the magnetic sublayers 58 and 54 may have the same magnetic moment.

Alternatively, the hard bias layers 31 may be formed so as to face both sides of all the magnetic sublayers 54, 56, and 58 constituting the free magnetic layer 24. In such a case, the thickness, etc. of the individual magnetic sublayers is appropriately adjusted so that the magnetic moment of the intermediate magnetic sublayer 56 is different from the magnetic moment of the upper magnetic sublayer 58 and the magnetic moment of the lower magnetic sublayer 54.

As shown in FIG. 1, by forming the insulating layers 29 and 32 above and below the hard bias layers 31, the sensing current flowing between the electrode layers 20 and 33 flows appropriately only in the multilayer film 28 and shunting of the sensing current into the regions at both sides of the multilayer film 28 can be suppressed.

If the bias underlayer 30 is provided only under the hard bias layer 31, the hard bias layer 31 and the magnetic sublayer 54 of the free magnetic layer 54 can form a magnetic continuum, and the domain of the free magnetic layer 24 can be controlled satisfactorily, which is desirable. The bias underlayer 30 may slightly intervene between the hard bias layer 31 and the magnetic sublayer 54. In such a case, the thickness in the X direction of the bias underlayer 30 in the intervenient section is preferably 1 nm or less. If the thickness exceeds 1 nm, the magnetic sublayer 54 of the free magnetic layer 24 is influenced by the demagnetizing field, which may result in buckling, and it becomes difficult to control the domain of the magnetic sublayer 54.

In the present invention, the lower pinned magnetic layer 22 and the upper pinned magnetic layer 26 have the ferrimagnetic structure. Thereby, the physical thickness of each of the pinned magnetic layers 22 and 26 can be increased by increasing the thickness of each of the magnetic sublayers 51, 53, 59, and 61, and the magnitude of each of the exchange coupling magnetic field generated between the pinned magnetic layer 22 and the antiferromagnetic layer 21 and the exchange coupling magnetic field generated between the pinned magnetic layer 26 and the antiferromagnetic layer 27 can be increased apparently. Specifically, the total thickness of the magnetic sublayers constituting each of the pinned magnetic layers 22 and 26 is preferably set at 45 Å to 195 Å. For example, the magnetic sublayers 51 and 61 are formed with a thickness of 5 Å, and the magnetic sublayers 53 and 59 are formed with a thickness of 40 Å. Alternatively, the magnetic sublayers 51 and 61 are formed with a thickness of 95 Å, and the magnetic sublayers 53 and 59 are formed with a thickness of 100 Å. Thereby, it is possible to display the bulk scattering effect satisfactorily, resulting in an improvement in the rate of change in resistance, and it is also possible to control the magnetizations of the pinned magnetic layers 22 and 26 appropriately.

Next, a method for fabricating the magnetic sensing element shown in FIG. 1 will be described below. In the dual spin-valve thin-film element, the magnetic sublayers 54 and 58 constituting the free magnetic layer 24 participate in the rate of change in resistance (ΔGMR), and electrical resistance changes due to the relationship between the varying magnetizations of the magnetic sublayers 54 and 58 and the pinned magnetizations of the magnetic sublayers 53 and 59 constituting the pinned magnetic layers 22 and 26. The magnetization directions of the magnetic sublayer 53 of the lower pinned magnetic layer 22 and the magnetic sublayer 59 of the upper pinned magnetic layer 26 must be controlled so that a change in resistance with respect to the magnetic sublayer 54 of the free magnetic layer 24 and the magnetic sublayer 53 of the lower pinned magnetic layer 22 and a change in resistance with respect to the magnetic sublayer 58 of the free magnetic layer 24 and the magnetic sublayer 59 of the upper pinned magnetic layer 26 exhibit the same variation.

In FIG. 1, the magnetizations of the magnetic sublayers 54 and 58 constituting the free magnetic layer 24 are magnetized in the X direction. The magnetic sublayer 53 of the lower pinned magnetic layer 22 and the magnetic sublayer 59 of the upper pinned magnetic layer 26 are magnetized in the same direction, and in this embodiment, the magnetic sublayers 53 and 59 are pinned in a direction opposite to the height direction.

In the embodiment shown in FIG. 1, the thickness of the magnetic sublayer 51 is smaller than the thickness of the magnetic sublayer 53 in the lower pinned magnetic layer 22. Therefore, the magnetic moment (Ms·t) of the magnetic sublayer 51 is smaller than the magnetic moment of the magnetic sublayer 53.

On the other hand, the thickness of the magnetic sublayer 61 is smaller than the thickness of the magnetic sublayer 59 in the upper pinned magnetic layer 26. Therefore, the magnetic moment (Ms·t) of the magnetic sublayer 61 is smaller than the magnetic moment of the magnetic sublayer 59.

After the lower pinned magnetic layer 22 and the upper pinned magnetic layer 26 are formed as described above, annealing is performed in a magnetic field.

The magnitude of the RKKY interaction generated between the magnetic sublayers 51 and 53 (or 59 and 61) is approximately 79 A/m to 395 A/m.

Therefore, when a magnetic field larger than the RKKY interaction is applied in the Y direction, and specifically, when a magnetic field larger than 395 A/M is applied, the magnetizations of the magnetic sublayers 51, 53, 59, and 61 constituting the pinned magnetic layers 22 and 26 are directed in the Y direction.

At this stage, by annealing treatment, the magnetizations of the magnetic sublayer 51 of the lower pinned magnetic layer 22 and the magnetic sublayer 61 of the upper pinned magnetic layer 26 are pinned in the Y direction because of the exchange coupling magnetic fields generated at the interfaces with the antiferromagnetic layers 21 and 27, respectively.

When the magnetic field is removed, the magnetization of the magnetic sublayer 53 of the lower pinned magnetic layer 22 is directed and pinned in a direction opposite to the Y direction by the RKKY interaction generated between the magnetic sublayer 51 and the magnetic sublayer 53. Similarly, the magnetization of the magnetic sublayer 59 of the upper pinned magnetic layer 26 is directed and pinned in the direction opposite to the Y direction by the RKKY interaction generated between the magnetic sublayer 61 and the magnetic sublayer 59.

As described above, when a magnetic field larger than the RKKY interaction is applied, in the embodiment shown in FIG. 1, regardless of the magnitude of the magnetic moments of the magnetic sublayers 51, 53, 59, and 61, the magnetic sublayers 53 and 59 facing the free magnetic layer 24 can be magnetized in the same direction. Consequently, when the free magnetic layer has a ferrimagnetic structure, the number of magnetic sublayers constituting the free magnetic layer 24 is preferably set to be an odd number, such as 3 or 5 so that the magnetization directions of the pinned magnetic layers can be controlled easily. In the case of the odd number, even if the magnetic sublayers have the same thickness, a ferrimagnetic structure can be formed. However, if the number of magnetic sublayers constituting the free magnetic layer 24 is excessively increased, the fabrication process becomes complex. Therefore, the number of magnetic sublayers constituting the free magnetic layer 24 is preferably three.

In the embodiment shown in FIG. 1, since the magnetic sublayer 53 has a larger magnetic moment than the magnetic sublayer 51, the resultant magnetic moment which is the vector sum of the magnetic moments of the magnetic sublayers 51 and 53 is directed in the direction opposite to the Y direction. Similarly, since the magnetic sublayer 59 has a larger magnetic moment than the magnetic sublayer 61, the resultant magnetic moment which is the vector sum of the magnetic moments of the magnetic sublayers 59 and 61 is directed in the direction opposite to the Y direction. If the direction of the resultant magnetic moment of the upper pinned magnetic layer 26 and the direction of the resultant magnetic moment of the lower pinned magnetic layer 22 are antiparallel, the influence of demagnetizing fields on the free magnetic layer 24 can be decreased, and the domain of the free magnetic layer 24 can be appropriately controlled. That is, for example, by making the magnetic moment of the magnetic sublayer 53 smaller than the magnetic moment of the magnetic sublayer 51, the resultant magnetic moment of the lower pinned magnetic layer 22 is directed in the Y direction, and by making the magnetic moment of the magnetic sublayer 59 larger than the magnetic moment of the magnetic sublayer 61, the resultant magnetic moment of the upper pinned magnetic layer 26 is directed in the direction opposite to the Y direction.

When the magnetic moment of the magnetic sublayer 53 is larger than the magnetic moment of the magnetic sublayer 51 and the magnetic moment of the magnetic sublayer 59 is larger than the magnetic moment of the magnetic sublayer 61 as in the embodiment shown in FIG. 1, or when the magnetic moment of the magnetic sublayer 53 is smaller than the magnetic moment of the magnetic sublayer 51 and the magnetic moment of the magnetic sublayer 59 is smaller than the magnetic moment of the magnetic sublayer 61, it is possible to magnetize the magnetic sublayers 53 and 59 in the same direction even if a magnetic field smaller than the RKKY interaction, that is, specifically, a magnetic field smaller than 79 A/m, is applied. The reason for this is that the magnetic sublayer having a larger magnetic moment is magnetized in the direction of the magnetic field and the magnetic sublayer having a smaller magnetic moment is magnetized in a direction opposite to the direction of the magnetic field by the RKKY interaction. When the magnetizations of the magnetic sublayers 51 and 61 are pinned by the exchange coupling magnetic fields generated at the interfaces with the antiferromagnetic layers 21 and 27, the magnetizations of the other magnetic sublayers 53 and 59 are pinned antiparallel to the magnetizations of the magnetic sublayers 51 and 61.

Figure 3:
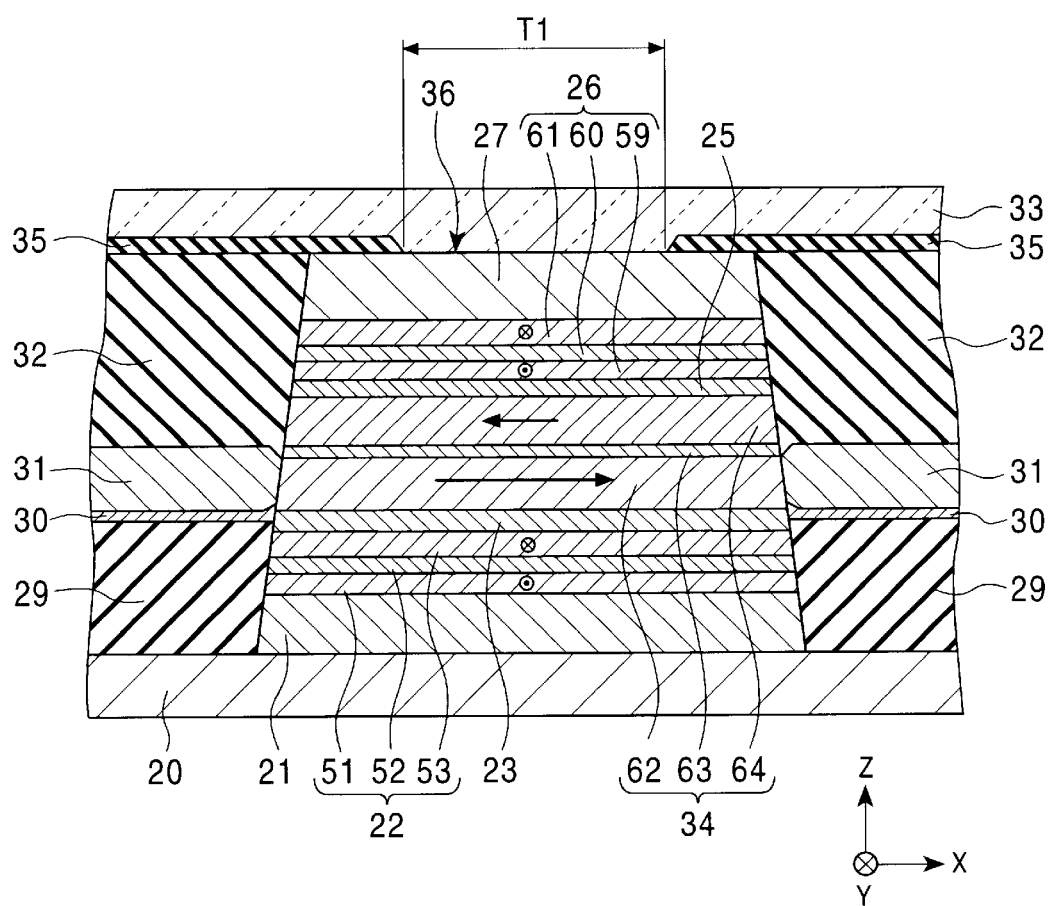
FIG. 3 is a partial sectional view of a magnetic sensing element in a second embodiment of the present invention, viewed from the surface facing a recording medium.

FIG. 3 is a partial sectional view of a magnetic sensing element in a second embodiment of the present invention, viewed from the surface facing a recording medium. The same layers as those in FIG. 1 are represented by the same reference numerals as those in FIG. 1.

The magnetic sensing element in this embodiment is also a CPP-type dual spin-valve thin-film element in which electrode layers 33 and 20 are formed on the upper and lower surfaces of a multilayer film 36.

The magnetic sensing element shown in FIG. 3 differs from the magnetic sensing element shown in FIG. 1 in that a free magnetic layer 34 has a three-layered structure which includes two magnetic sublayers 62 and 64 and an intermediate sublayer 63. The material for the magnetic sublayers 62 and 64 and the material for the intermediate sublayer 63 are the same as the material for the magnetic sublayers 54, 56, and 58 and the material for the intermediate layers 55 and 57 shown in FIG. 1, respectively.

In this embodiment, preferably, the magnetic sublayers 62 and 64 of the free magnetic layer 34 are formed with a thickness of 40 Å to 100 Å.

In the present invention, the total thickness of the magnetic sublayers 62 and 64 constituting the free magnetic layer 34 is preferably in the range of 85 Å to 195 Å. Specifically, for example, the magnetic sublayer 62 is formed with a thickness of 45 Å and the magnetic sublayer 64 is formed with a thickness of 40 Å. Alternatively, the magnetic sublayer 62 is formed with a thickness of 100 Å and the magnetic sublayer 64 is formed with a thickness of 95 Å.

In this embodiment, the magnetic sublayer 62 and the magnetic sublayer 64 have different magnetic moments so that the free magnetic layer 34 has a ferrimagnetic structure appropriately. In FIG. 3, the magnetic sublayer 64 has a smaller thickness than that of the magnetic sublayer 62, and the magnetic moment of the magnetic sublayer 64 is smaller than the magnetic moment of the magnetic sublayer 62.

Since the free magnetic layer 34 has a ferrimagnetic structure, even if the thickness of the magnetic sublayer 62 and the thickness of the magnetic sublayer 64 are increased within the ranges described above and the physical thickness of the free magnetic layer 34 is increased, the magnetic thickness can be decreased. Therefore, the bulk scattering effect can be displayed satisfactorily, the rate of change in resistance can be improved appropriately, and it is possible to fabricate a magnetic sensing element having excellent sensitivity.

In the present invention, the resultant magnetic moment (saturation magnetization Ms×thickness t) of the free magnetic layer 34 is preferably in the range of 5 T·Å to 60 T·Å.

In the embodiment shown in FIG. 3, the vector sum of the magnetic moments of the magnetic sublayers 62 and 64 corresponds to the resultant magnetic moment. In order to set the resultant magnetic moment within the range described above, the material and thickness for the magnetic layers 62 and 64 must be appropriately adjusted.

If the free magnetic layer 34 has the resultant magnetic moment described above, the magnetization of the free magnetic layer 34 can be varied sensitively in response to an external magnetic field and read output can be improved appropriately.

In the present invention, more preferably, the resultant magnetic moment of the free magnetic layer 34 is 30 T·Å or less.

Since the magnetic sensing element shown in FIG. 3 is the CPP-type element, the change in resistance (ΔR) corresponds to the sum of series connection (see FIG. 2), and the rate of change in resistance (ΔGMR) can be increased compared to the CIP-type element in which the change in resistance corresponds to the sum of parallel connection.

In the embodiment shown in FIG. 3, the hard bias layers 31 are formed only on both sides in the track width direction (in the X direction) of the magnetic sublayer 62 of the free magnetic layer 34. The magnetic sublayer 62 is magnetized, for example, in the X direction by the longitudinal bias magnetic field from the hard bias layer 31. Consequently, the other magnetic sublayer 64 is magnetized in a direction opposite to the X direction by the RKKY interaction with the magnetic sublayer 62. Thus, the magnetizations of the magnetic sublayers 62 and 64 are antiparallel.

In this embodiment, since the magnetic sublayers 62 and 64 have different magnetic moments, even if the hard bias layers are formed to face both sides of the magnetic sublayers 62 and 64, the magnetic sublayer 62 having a larger magnetic moment is magnetized in the X direction under the strong influence of the longitudinal bias magnetic field from the hard bias layer 31, and the magnetic sublayer 64 is magnetized in the direction opposite to the X direction by the RKKY interaction with the magnetic sublayer 62.

By forming the insulating layers 29 and 32 above and below the hard bias layers 31, the sensing current flowing between the electrode layers 20 and 33 flows appropriately only in the multilayer film 36 and shunting of the sensing current into the regions at both sides of the multilayer film 36 can be suppressed.

In this embodiment, insulating layers 35 extend over side regions of the upper antiferromagnetic layer 27 in the track width direction, and there is a predetermined distance T1 between the insulating layers 35. If the insulating layers 35 are placed between the second electrode layer 33 and the side regions of the antiferromagnetic layer 27, the sensing current from the second electrode layer 33 only flows in the multilayer film 36 with the distance T1.

Consequently, even if the actual element size of the multilayer film 36 is increased, the current path into the multilayer film 36 can be narrowed, and the element size (effective element size) which participates in the magnetoresistance effect effectively can be reduced. As a result, even if the multilayer film 36 with a large element size is formed with an accuracy of commonly used photolithography, it is possible to produce a magnetic sensing element having a large read output. Additionally, insulating layers 35 may also be included in the magnetic sensing element shown FIG. 1.

Next, a method for fabricating the magnetic sensing element shown in FIG. 3 will be described below. In the dual spin-valve thin-film element as shown in FIG. 3, the magnetic sublayers 62 and 64 constituting the free magnetic layer 34 participate in the rate of change in resistance (ΔGMR), and electrical resistance changes due to the relationship between the varying magnetizations of the magnetic sublayers 62 and 64 and the pinned magnetizations of the magnetic sublayers 53 and 59 constituting the pinned magnetic layers 22 and 26. The magnetization directions of the magnetic sublayer 53 of the lower pinned magnetic layer 22 and the magnetic sublayer 59 of the upper pinned magnetic layer 26 must be controlled so that a change in resistance with respect to the magnetic sublayer 62 of the free magnetic layer 24 and the magnetic sublayer 53 of the lower pinned magnetic layer 22 and a change in resistance with respect to the magnetic sublayer 64 of the free magnetic layer 34 and the magnetic sublayer 59 of the upper pinned magnetic layer 26 exhibit the same variation.

In FIG. 3, the magnetic sublayers 62 and 64 are magnetized in an antiparallel state relative to the direction parallel to the track width direction. Therefore, the magnetic sublayer 53 of the lower pinned magnetic layer 22 and the magnetic sublayer 59 of the upper pinned magnetic layer 26 are magnetized in an antiparallel state relative to the direction parallel to the height direction. In this embodiment, the magnetic sublayer 53 is magnetized in the Y direction, and the magnetic sublayer 59 is magnetized in the direction opposite to the Y direction.

In the embodiment shown in FIG. 3, the thickness of the magnetic sublayer 51 is smaller than the thickness of the magnetic sublayer 53 in the lower pinned magnetic layer 22. Therefore, the magnetic moment (Ms·t) of the magnetic sublayer 51 is smaller than the magnetic moment of the magnetic sublayer 53.

On the other hand, the thickness of the magnetic sublayer 61 is larger than the thickness of the magnetic sublayer 59 in the upper pinned magnetic layer 26. Therefore, the magnetic moment (Ms·t) of the magnetic sublayer 61 is larger than the magnetic moment of the magnetic sublayer 59.

After the lower pinned magnetic layer 22 and the upper pinned magnetic layer 26 are formed as described above, annealing is performed in a magnetic field.

The magnitude of the RKKY interaction generated between the magnetic sublayers 51 and 53 (or 59 and 61) is approximately 79 A/m to 395 A/m.

A magnetic field smaller than the RKKY interaction is applied in the Y direction, that is, specifically, a magnetic field smaller than 79 A/m is applied. As a result, the magnetizations of the magnetic sublayer 53 of the lower pinned magnetic layer 22 and the magnetic sublayer 61 of the upper pinned magnetic layer 26, each having a larger magnetic moment, are directed in the Y direction.

Consequently, the magnetic sublayer 51 of the lower pinned magnetic layer 22 is magnetized in the direction opposite to the Y direction by the RKKY interaction, the magnetization direction of the magnetic sublayer 51 is pinned in the direction opposite to the Y direction by the exchange coupling magnetic field generated at the interface with the lower antiferromagnetic layer 21, and the magnetic sublayer 53 is magnetized in the Y direction.

Similarly, the magnetic sublayer 59 of the upper pinned magnetic layer 26 is magnetized in the direction opposite to the Y direction. The magnetization of the magnetic sublayer 61 is pinned in the Y direction by the exchange coupling magnetic field generated at the interface with the upper antiferromagnetic layer 27, and the magnetization of the magnetic sublayer 59 is pinned in the direction opposite to the Y direction.

Alternatively, the magnetic moment of the magnetic sublayer 51 is set larger than the magnetic moment of the magnetic sublayer 53 in the lower pinned magnetic layer 22 and the magnetic moment of the magnetic sublayer 61 is set smaller than the magnetic moment of the magnetic sublayer 59 in the upper pinned magnetic layer 26. Thereby, the magnetic sublayers 53 and 59 facing the free magnetic layer 34 can be magnetized antiparallel relative to the direction parallel to the height direction.

Additionally, in the magnetic sensing element shown in FIG. 1, the number of magnetic sublayers constituting the free magnetic layer 24 is three, and in the magnetic sensing element shown in FIG. 3, the number of magnetic sublayers constituting the free magnetic layer 34 is two. In the present invention, any number of magnetic sublayers is acceptable as long as the number is two or more.

Figure 4:
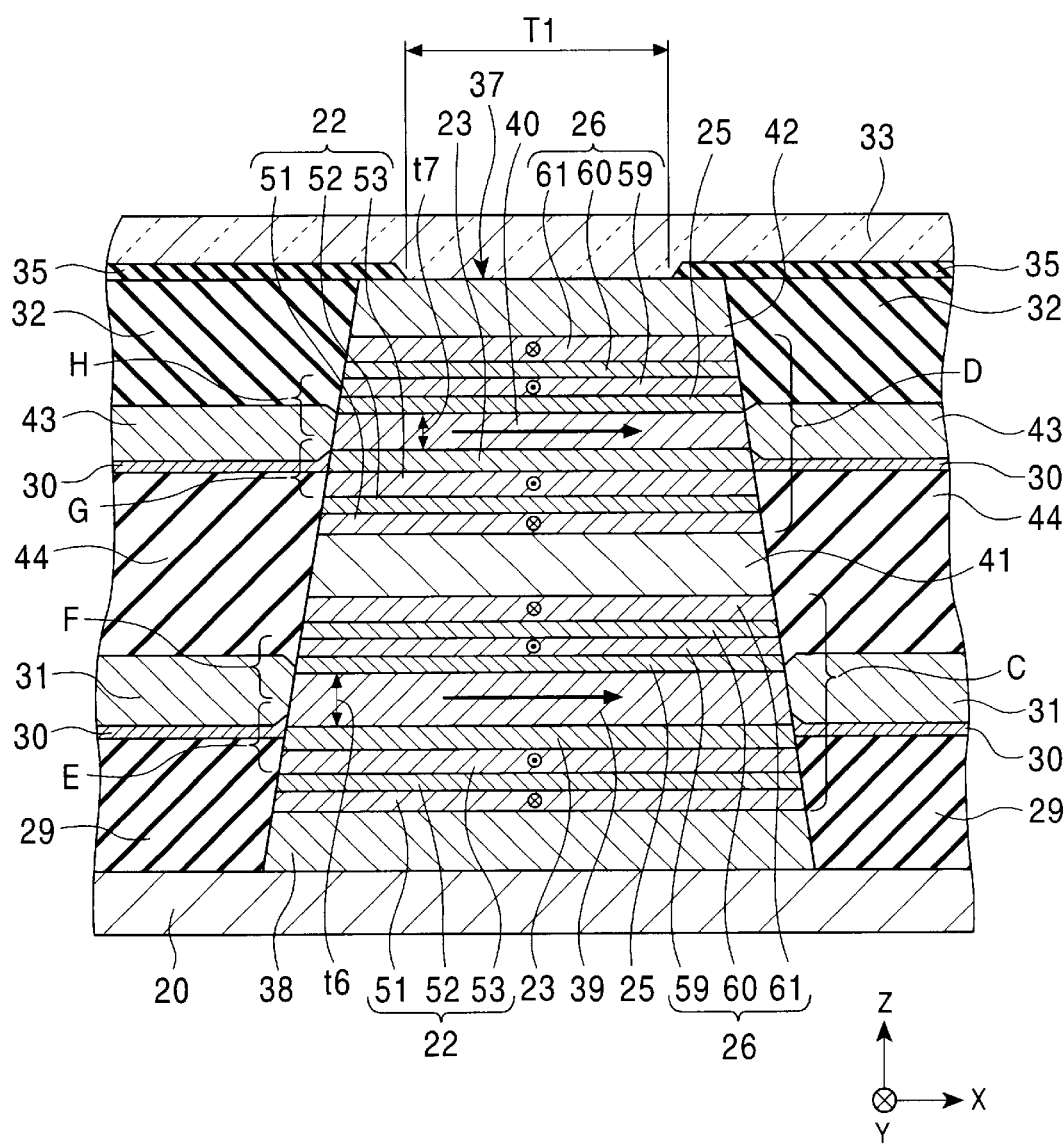
FIG. 4 is a partial sectional view of a magnetic sensing element in a third embodiment of the present invention, viewed from the surface facing a recording medium.

FIG. 4 is a partial sectional view of a magnetic sensing element in a third embodiment of the present invention, viewed from the surface facing a recording medium. The same layers as those in FIG. 1 are represented by the same reference numerals as those in FIG. 1.

Although the magnetic sensing element in this embodiment is also a CPP-type element in which the sensing current from any one of the electrode layers 20 and 33 flows perpendicular to the planes of the individual layers of a multilayer film 37, the number of layers of this magnetic sensing element is larger compared to the dual spin-valve thin-film elements shown in FIGS. 1 and 3.

In this embodiment, an antiferromagnetic layer 41 is formed between a multilayer film C and a multilayer film D, a lower antiferromagnetic layer 38 is formed on the lower surface of the multilayer film C, and an upper antiferromagnetic layer 42 is formed on the upper surface of the multilayer film D.

The multilayer films C and D have the same film structure. That is, the multilayer film C or D includes a free magnetic layer 39 or 40, an upper nonmagnetic interlayer 25 formed on the free magnetic layer, a lower nonmagnetic interlayer 23 formed under the free magnetic layer, an upper pinned magnetic layer 26 placed on the upper nonmagnetic interlayer 25, and a lower pinned magnetic layer 22 placed under the lower nonmagnetic interlayer 23.

In the dual spin-valve thin-film element shown in FIG. 1 or 3, only one free magnetic layer is provided, and two spots, i.e., the three-layered portions A and B, participate in the magnetoresistance effect. However, in the magnetic sensing element shown in FIG. 4, two free magnetic layers, i.e., the free magnetic layers 39 and 40, are provided, and four spots participate in the magnetoresistance effect, i.e., in the multilayer film C, a three-layer portion E including the magnetic sublayer 53 of the lower pinned magnetic layer 22, the lower nonmagnetic interlayer 23, and the free magnetic layer 39, and a three-layered portion F including the magnetic sublayer 59 of the upper pinned magnetic layer 26, the upper nonmagnetic interlayer 25, and the free magnetic layer 39, and in the multilayer film D, a three-layer portion G including the magnetic sublayer 53 of the lower pinned magnetic layer 22, the lower nonmagnetic interlayer 23, and the free magnetic layer 40, and a three-layer portion H including the magnetic sublayer 59 of the upper pinned magnetic layer 26, the upper nonmagnetic interlayer 25, and the free magnetic layer 40.

Therefore, in the magnetic sensing element shown in FIG. 4, it is possible to obtain a rate of change in resistance approximately twice as high as that of the dual spin-valve thin-film element shown in FIG. 1 or 3.

In this embodiment, each of the thickness t6 of the free magnetic layer 39 and the thickness t7 of the free magnetic layer 40 is preferably in the range of 40 Å to 100 Å. In this embodiment, since the number of layers can be increased compared to the dual spin-valve thin-film element shown in FIG. 1 or 3, even if the thickness of the free magnetic layers 39 and 40 is small in the range described above, it is possible to extend the mean free path of the conduction electrons. Consequently, the magnetic moments of the free magnetic layers 39 and 40 can be decreased, satisfactory sensitivity is obtained, and the read output can be increased. The rate of change in resistance can also be improved.

Since the magnetic sensing element shown in FIG. 4 is the CPP type, even if spin-independent scattering occurs in the vicinity of the antiferromagnetic layer 41 placed between the multilayer films C and D, the change in resistance (ΔR) corresponds to the sum of series connection (see FIG. 2), and the rate of change in resistance (ΔGMR) can be increased compared to the CIP-type element in which the change in resistance corresponds to the sum of parallel connection.

In the embodiment shown in FIG. 4, the hard bias layers 31 and 43 are formed only on both sides in the track width direction of the free magnetic layers 39 and 40, and the free magnetic layers 39 and 40 are magnetized, for example, in the X direction, by the longitudinal bias magnetic fields from the hard bias layers 31 and 43.

In this embodiment, the hard bias layers 31 and 43 are locally provided on both sides of the free magnetic layers 39 and 40, and insulating layers 44 are formed between the hard bias layers 31 and 43. The insulating layers 44 may be omitted, and hard bias layers may be provided so as to face both sides of the laminate including the lower free magnetic layer 39 to the upper free magnetic layer 40.

As shown in FIG. 4, by forming the insulating layers 29 and 32 below the hard bias layer 31 and above the hard bias layer 43, respectively, the sensing current flowing between the electrode layers 20 and 33 flows appropriately only in the multilayer film 37 and shunting of the sensing current into the regions at both sides of the multilayer film 37 can be suppressed.

In this embodiment, insulating layers 35 extend over side regions of the upper antiferromagnetic layer 42 in the track width direction, and there is a predetermined distance T1 between the insulating layers 35. If the insulating layers 35 are placed between the second electrode layer 33 and the side regions of the upper antiferromagnetic layer 42, the sensing current from the second electrode layer 33 only flows in the multilayer film 37 with the distance T1.

Consequently, even if the actual element size of the multilayer film 37 is increased, the current path into the multilayer film 37 can be narrowed, and the element size (effective element size) which participates in the magnetoresistance effect effectively can be reduced. As a result, even if the multilayer film 37 with a large element size is formed with an accuracy of commonly used photolithography, it is possible to produce a magnetic sensing element having a large read output.

Next, a method for fabricating the magnetic sensing element shown in FIG. 4 will be described below, which is similar to the method for fabricating the magnetic sensing element shown in FIG. 1.

That is, the magnetic sublayers 51 and 53 in the lower pinned magnetic layer 22 are formed so as to have different magnetic moments, and the magnetic sublayers 59 and 61 in the upper pinned magnetic layer 26 are formed so as to have different magnetic moments.

Next, annealing is performed in a magnetic field larger than the RKKY interaction, i.e., specifically, in a magnetic field of 395 A/m or more, and for example, in the embodiment shown in FIG. 4, a magnetic field is applied in the Y direction. Thereby, the magnetizations of the magnetic sublayers 51 and 61 in contact with the antiferromagnetic layers 38, 41, and 42 are pinned in the Y direction by the exchange coupling magnetic fields with the antiferromagnetic layers.

When the magnetic field is removed, the magnetizations of the magnetic sublayers 53 and 59 are directed and pinned in the direction opposite to the Y direction by the RKKY interactions with the magnetic sublayers 51 and 61.

Alternatively, the magnetic moments of the magnetic sublayers 51 and 61 in contact with the antiferromagnetic layers 38, 41, and 42 are set smaller or larger than the magnetic moments of the magnetic layers 53 and 59, respectively, and a magnetic field smaller than the RKKY interaction, i.e., specifically, a magnetic field of less than 79 A/m, is applied to produce a magnetic sensing element having the magnetization directions shown in FIG. 4.

Figure 5:
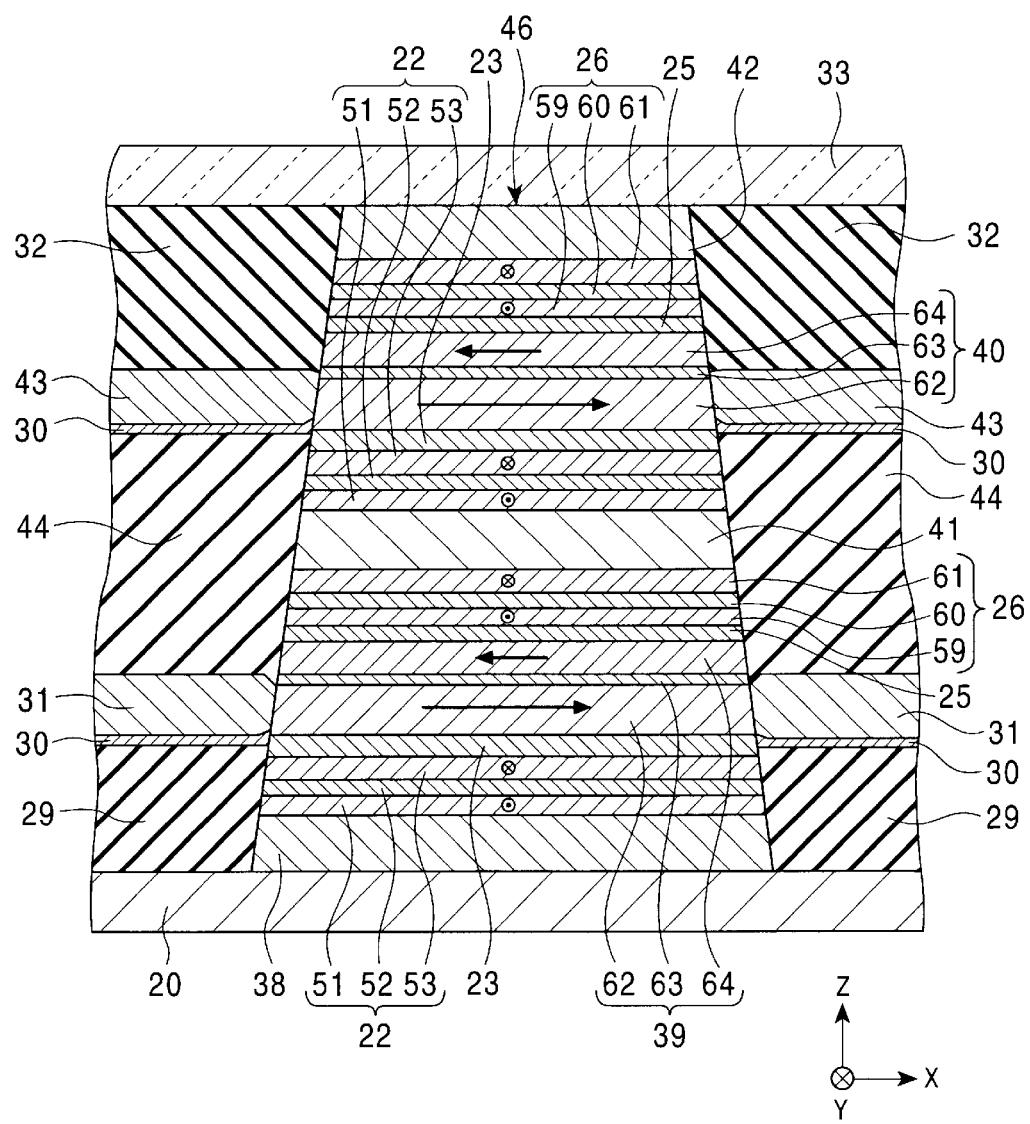
FIG. 5 is a partial sectional view of a magnetic sensing element in a fourth embodiment of the present invention, viewed from the surface facing a recording medium.

FIG. 5 is a partial sectional view of a magnetic sensing element in a fourth embodiment of the present invention, viewed from the surface facing a recording medium. The same layers as those in FIG. 4 are represented by the same reference numerals as those in FIG. 4.

The magnetic sensing element shown in FIG. 5 differs from the magnetic sensing element shown in FIG. 4 in that the free magnetic layers 39 and 40 have a three-layered ferrimagnetic structure.

In this embodiment, preferably, the thickness of each of the free magnetic layers 39 and 40 is also in the range of 40 Å to 100 Å.

The total thickness of the magnetic sublayers 62 and 64 constituting each of the free magnetic layers 39 and 40 is preferably in the range of 85 Å to 195 Å.

In this embodiment, the magnetic sublayers 62 and 64 are formed so as to have different magnetic moments so that each of the free magnetic layers 39 and 40 has a ferrimagnetic structure appropriately. In the magnetic sensing element shown in FIG. 5, the thickness of the magnetic sublayer 64 is smaller than the thickness of the magnetic sublayer 62, and the magnetic moment of the magnetic sublayer 64 is smaller than the magnetic moment of the magnetic sublayer 62.

Since each of the free magnetic layers 39 and 40 has the ferrimagnetic structure, even if the thickness of the magnetic sublayer 62 and the thickness of the magnetic sublayer 64 are increased and the physical thickness of each of the free magnetic layers 39 and 40 is increased, the magnetic thickness can be decreased. Therefore, the bulk scattering effect can be displayed satisfactorily, the rate of change in resistance can be improved appropriately, and it is also possible to fabricate a magnetic sensing element having excellent sensitivity.

In the present invention, the resultant magnetic moment (saturation magnetization Ms×thickness t) of each of the free magnetic layers 39 and 40 is preferably in the range of 5 T·Å to 60 T·Å.

In the embodiment shown in FIG. 5, the vector sum of the magnetic moments of the magnetic sublayers 62 and 64 corresponds to the resultant magnetic moment. In order to set the resultant magnetic moment within the range described above, the material and thickness for the magnetic sublayers 62 and 64 must be appropriately adjusted.

If each of the free magnetic layers 39 and 40 has the resultant magnetic moment described above, the magnetization of each of the free magnetic layers 39 and 40 can be varied sensitively in response to an external magnetic field and the read output can be improved appropriately.

In the present invention, more preferably, the resultant magnetic moment of each of the free magnetic layers 39 and 40 is 30 T·Å or less.

Since the magnetic sensing element shown in FIG. 5 is the CPP-type element, the change in resistance ($\Delta R$) corresponds to the sum of series connection (see FIG. 2), and the rate of change in resistance ($\Delta GMR$) can be increased compared to the CIP-type element in which the change in resistance corresponds to the sum of parallel connection.

In the embodiment shown in FIG. 5, the hard bias layers 31 and 43 are formed only on both sides in the track width direction (in the X direction) of the magnetic sublayers 62 of the free magnetic layers 39 and 40. The magnetic sublayer 62 is magnetized, for example, in the X direction by the longitudinal bias magnetic field from the hard bias layer 31 or 43. Consequently, the other magnetic sublayer 64 is magnetized in a direction opposite to the X direction by the RKKY interaction with the magnetic sublayer 62. Thus, the magnetizations of the magnetic sublayers 62 and 64 are antiparallel.

In this embodiment, since the magnetic sublayers 62 and 64 have different magnetic moments, even if the hard bias layers 31 or 43 are formed to face both sides of the magnetic sublayers 62 and 64, the magnetic sublayer 62 having a larger magnetic moment is magnetized in the X direction under the strong influence of the longitudinal bias magnetic field from the hard bias layer 31 or 43, and the magnetic sublayer 64 is magnetized in the direction opposite to the X direction by the RKKY interaction with the magnetic sublayer 62.

Alternatively, the hard bias layers may be placed on both sides of the laminate including the lower free magnetic layer 39 to the upper free magnetic layer 40.

By forming the insulating layers 29 and 32 above the hard bias layer 43 and below the hard bias layers 31, the sensing current flowing between the electrode layers 20 and 33 flows appropriately only in the multilayer film 46 and shunting of the sensing current into the regions at both sides of the multilayer film 46 can be suppressed.

Additionally, in this embodiment, insulating layers 35 may also be provided so as to extend over the side regions of the antiferromagnetic layer 42 as shown in FIG. 4.

Next, a method for fabricating the magnetic sensing element shown in FIG. 5 will be described below. In the magnetic sensing element having the structure shown in FIG. 5, the magnetic sublayers 62 and 64 constituting the free magnetic layers 39 and 40 participate in the rate of change in resistance (ΔGMR), and electrical resistance changes due to the relationship between the varying magnetizations of the magnetic sublayers 62 and 64 and the pinned magnetizations of the magnetic sublayers 53 and 59 constituting the pinned magnetic layers 22 and 26. The magnetization directions of the magnetic sublayer 53 of the lower pinned magnetic layer 22 and the magnetic sublayer 59 of the upper pinned magnetic layer 26 must be controlled so that a change in resistance with respect to the magnetic sublayer 62 of the free magnetic layer 39 or 40 and the magnetic sublayer 53 of the lower pinned magnetic layer 22 and a change in resistance with respect to the magnetic sublayer 64 of the free magnetic layer 39 or 40 and the magnetic sublayer 59 of the upper pinned magnetic layer 26 exhibit the same variation.

In FIG. 5, the magnetic sublayers 62 and 64 are magnetized in an antiparallel state relative to the direction parallel to the track width direction. Therefore, the magnetic sublayer 53 of the lower pinned magnetic layer 22 and the magnetic sublayer 59 of the upper pinned magnetic layer 26 are magnetized in an antiparallel state relative to the direction parallel to the height direction. In this embodiment, the magnetic sublayer 53 is magnetized in the Y direction, and the magnetic sublayer 59 is magnetized in the direction opposite to the Y direction.

In the embodiment shown in FIG. 5, the thickness of the magnetic sublayer 51 is smaller than the thickness of the magnetic sublayer 53 in the lower pinned magnetic layer 22. Therefore, the magnetic moment (Ms·t) of the magnetic sublayer 51 is smaller than the magnetic moment of the magnetic sublayer 53.

On the other hand, the thickness of the magnetic sublayer 61 is larger than the thickness of the magnetic sublayer 59 in the upper pinned magnetic layer 26. Therefore, the magnetic moment (Ms·t) of the magnetic sublayer 61 is larger than the magnetic moment of the magnetic sublayer 59.

After the lower pinned magnetic layer 22 and the upper pinned magnetic layer 26 are formed as described above, annealing is performed in a magnetic field. In the annealing process in the magnetic field, for example, a magnetic field smaller than the RKKY interaction is applied in the Y direction, that is, specifically, a magnetic field smaller than 79 A/m is applied. As a result, the magnetizations of the magnetic sublayer 53 of the lower pinned magnetic layer 22 and the magnetic sublayer 61 of the upper pinned magnetic layer 26, each having a larger magnetic moment, are directed in the Y direction.

Consequently, the magnetic sublayer 51 of the lower pinned magnetic layer 22 is magnetized in the direction opposite to the Y direction by the RKKY interaction, the magnetization direction of the magnetic sublayer 51 is pinned in the direction opposite to the Y direction by the exchange coupling magnetic field generated at the interface with the lower antiferromagnetic layer 38, and the magnetic sublayer 53 is magnetized in the Y direction.

Similarly, the magnetic sublayer 59 of the upper pinned magnetic layer 26 is magnetized in the direction opposite to the Y direction by the RKKY interaction. The magnetization of the magnetic sublayer 61 is pinned in the Y direction by the exchange coupling magnetic field generated at the interface with the upper antiferromagnetic layer 42, and the magnetization of the magnetic sublayer 59 is pinned in the direction opposite to the Y direction.

Alternatively, the magnetic moment of the magnetic sublayer 51 is set larger than the magnetic moment of the magnetic sublayer 53 in the lower pinned magnetic layer 22 and the magnetic moment of the magnetic sublayer 61 is set smaller than the magnetic moment of the magnetic sublayer 59 in the upper pinned magnetic layer 26. Thereby, the magnetic sublayers 53 and 59 facing the free magnetic layer 39 or 40 can be magnetized antiparallel to each other.

Additionally, although the number of magnetic sublayers constituting the free magnetic layer 39 or 40 is two in the embodiment shown in FIG. 5, the number of magnetic sublayers may be three as in the embodiment shown in FIG. 1 or more than three magnetic sublayers may be formed.

Figure 6:
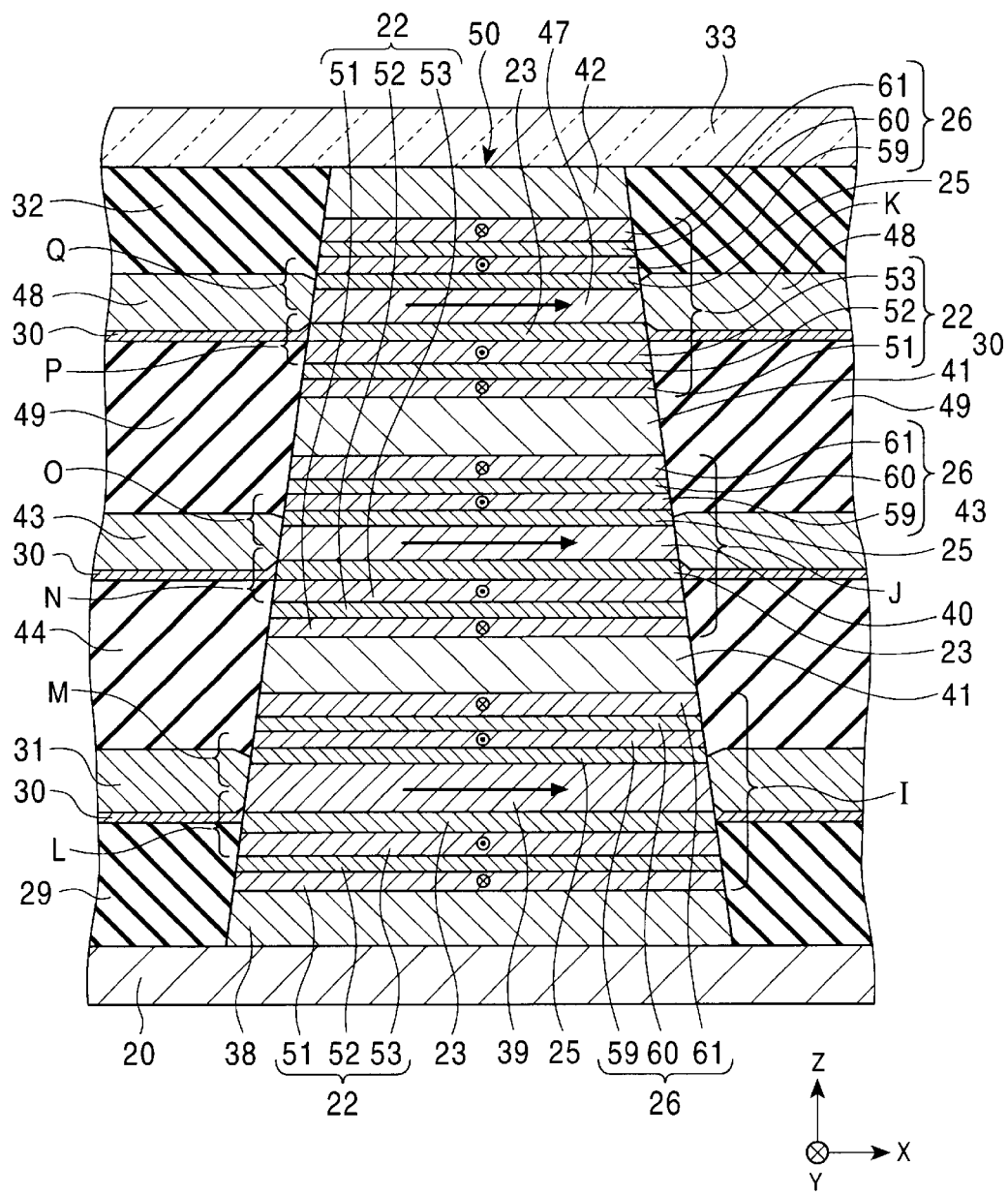
FIG. 6 is a partial sectional view of a magnetic sensing element in a fifth embodiment of the present invention, viewed from the surface facing a recording medium.

FIG. 6 is a partial sectional view of a magnetic sensing element in a fifth embodiment of the present invention, viewed from the surface facing a recording medium. The same layers as those in FIG. 4 are represented by the same reference numerals as those in FIG. 4.

In this embodiment, antiferromagnetic layers 41 are formed between a multilayer film I and a multilayer film J and between the multilayer film J and a multilayer film K. A lower antiferromagnetic layer 38 is formed on the lower surface of the multilayer film I, and an upper antiferromagnetic layer 42 is formed on the upper surface of the multilayer film K.

The multilayer films I, J, and K have the same film structure. That is, in the multilayer film I, J, or K, an upper nonmagnetic interlayer 25 is placed on a free magnetic layer 39, 40, or 47, a lower nonmagnetic interlayer 23 is placed under the free magnetic layer 39, 40, or 47, an upper pinned magnetic layer 26 is placed on the upper nonmagnetic interlayer 25, and a lower pinned magnetic layer 22 is placed under the lower nonmagnetic interlayer 23.

In the dual spin-valve thin-film element shown in FIG. 1 or 3, only one free magnetic layer is provided and two spots, i.e., the three-layered portions A and B, participate in the magnetoresistance effect. However, in the magnetic sensing element shown in FIG. 5, three free magnetic layers, i.e., the free magnetic layers 39, 40, and 47, are provided, and six spots participate in the magnetoresistance effect, i.e., in the multilayer film I, a three-layer portion L including the magnetic sublayer 53 of the lower pinned magnetic layer 22, the lower nonmagnetic interlayer 23, and the free magnetic layer 39, and a three-layered portion M including the magnetic sublayer 59 of the upper pinned magnetic layer 26, the upper nonmagnetic interlayer 25, and the free magnetic layer 39; in the multilayer film J, a three-layer portion N including the magnetic sublayer 53 of the lower pinned magnetic layer 22, the lower nonmagnetic interlayer 23, and the free magnetic layer 40, and a three-layer portion O including the magnetic sublayer 59 of the upper pinned magnetic layer 26, the upper nonmagnetic interlayer 25, and the free magnetic layer 40; and in the multilayer film K, a three-layer portion P including the magnetic sublayer 53 of the lower pinned magnetic layer 22, the lower nonmagnetic interlayer 23, and the free magnetic layer 47, and a three-layer portion Q including the magnetic sublayer 59 of the upper pinned magnetic layer 26, the upper nonmagnetic interlayer 25, and the free magnetic layer 47.

Therefore, in the magnetic sensing element shown in FIG. 6, it is possible to obtain a rate of change in resistance approximately three times as high as that of the dual spin-valve thin-film element shown in FIG. 1 or 3.

In this embodiment, preferably, the thickness of each of the free magnetic layers 39, 40, and 47 is in the range of 40 Å to 100 Å. In this embodiment, since the number of layers can be increased compared to the dual spin-valve thin-film element shown in FIG. 1 or 3, even if the thickness of each of the free magnetic layers 39, 40, and 41 is small in the range described above, it is possible to extend the mean free path of the conduction electrons. Consequently, the magnetic moments of the free magnetic layers 39, 40, and 47 can be decreased, satisfactory sensitivity is obtained, and read output can be increased. The rate of change in resistance can also be improved.

Since the magnetic sensing element shown in FIG. 6 is the CPP type, even if spin-independent scattering occurs in the vicinity of the antiferromagnetic layers 41 placed between the multilayer films I and J and between the multilayer films J and K, the change in resistance (ΔR) corresponds to the sum of series connection (see FIG. 2), and the rate of change in resistance (ΔGMR) can be increased compared to the CIP-type element in which the change in resistance corresponds to the sum of parallel connection.

In the embodiment shown in FIG. 6, the hard bias layers 31, 43, and 48 are formed only on both sides in the track width direction of the free magnetic layers 39, 40, and 47, and the free magnetic layers 39, 40, and 47 are magnetized, for example, in the X direction, by the longitudinal bias magnetic fields from the hard bias layers 31, 43, and 48.

In this embodiment, the hard bias layers 31, 43, and 48 are locally provided on both sides of the free magnetic layers 39, 40, and 47. Insulating layers 44 are formed between the hard bias layers 31 and 43, and insulating layers 49 are formed between the hard bias layers 43 and 48. The insulating layers 44 and 49 may be omitted, and hard bias layers may be provided so as to face both sides of the laminate including the lower free magnetic layer 39 to the upper free magnetic layer 47.

As shown in FIG. 6, by forming the insulating layers 29 and 32 below the hard bias layer 31 and above the hard bias layer 48, respectively, the sensing current flowing between the electrode layers 20 and 33 flows appropriately only in the multilayer film 50 and shunting of the sensing current into the regions at both sides of the multilayer film 50 can be suppressed.

Additionally, in this embodiment, insulating layers 35 may also be provided so as to extend over the side regions of the upper antiferromagnetic layer 42 as shown in FIG. 4.

Next, a method for fabricating the magnetic sensing element shown in FIG. 6 will be described below, which is similar to the method for fabricating the magnetic sensing element shown in FIG. 4.

That is, the magnetic sublayers 51 and 53 in the lower pinned magnetic layer 22 are formed so as to have different magnetic moments, and the magnetic sublayers 59 and 61 in the upper pinned magnetic layer 26 are formed so as to have different magnetic moments.

Next, annealing is performed in a magnetic field larger than the RKKY interaction, i.e., specifically, in a magnetic field of more than 395 A/m, and for example, in the embodiment shown in FIG. 6, a magnetic field is applied in the Y direction. Thereby, the magnetizations of the magnetic sublayers 51 and 61 in contact with the antiferromagnetic layers 38, 41, and 42 are pinned in the Y direction by the exchange coupling magnetic fields with the antiferromagnetic layers.

When the magnetic field is removed, the magnetizations of the magnetic sublayers 53 and 59 are directed and pinned in the direction opposite to the Y direction by the RKKY interactions with the magnetic sublayers 51 and 61.

Alternatively, the magnetic moments of the magnetic sublayers 51 and 61 in contact with the antiferromagnetic layers 38, 41, and 42 are set smaller or larger than the magnetic moments of the magnetic layers 53 and 59, respectively, and a magnetic field smaller than the RKKY interaction, i.e., specifically, a magnetic field of less than 79 A/m, is applied to produce a magnetic sensing element having the magnetization directions as shown in FIG. 4.

In the magnetic sensing element shown in FIG. 4, two multilayer films, i.e., the multilayer films C and D, are provided, and in the magnetic sensing element shown in FIG. 6, three multilayer films, i.e., the multilayer films I, J, and K, are provided. In the present invention, two or more multilayer films are provided.

Figure 7:
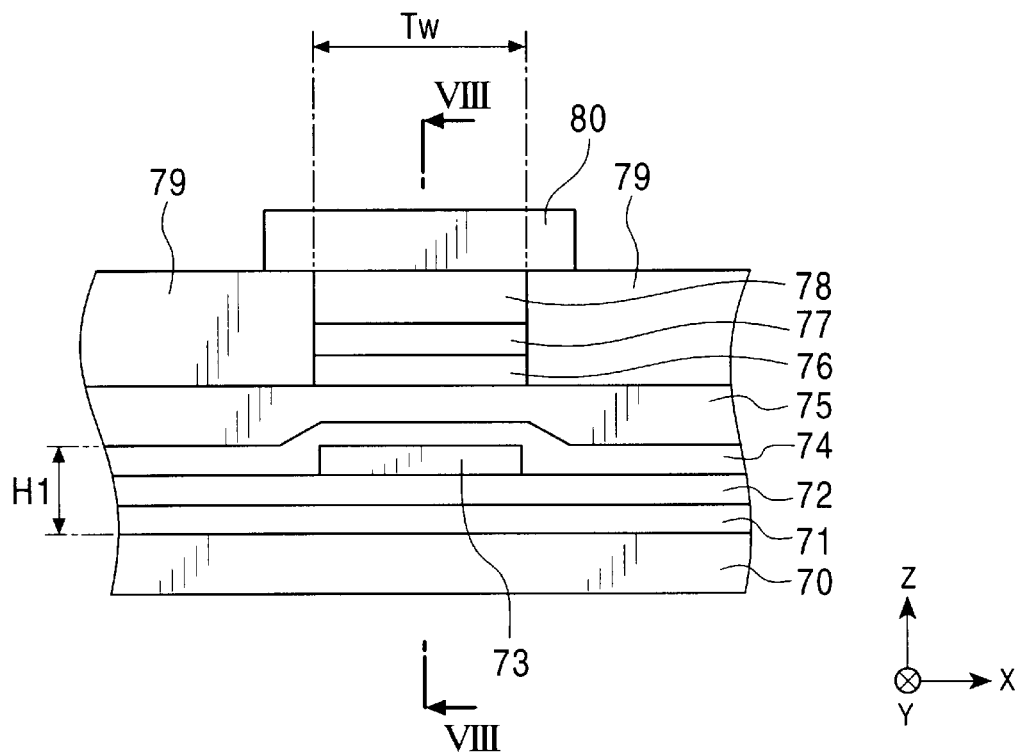
FIG. 7 is a partial front view of a thin-film magnetic head of the present invention.
Figure 8:
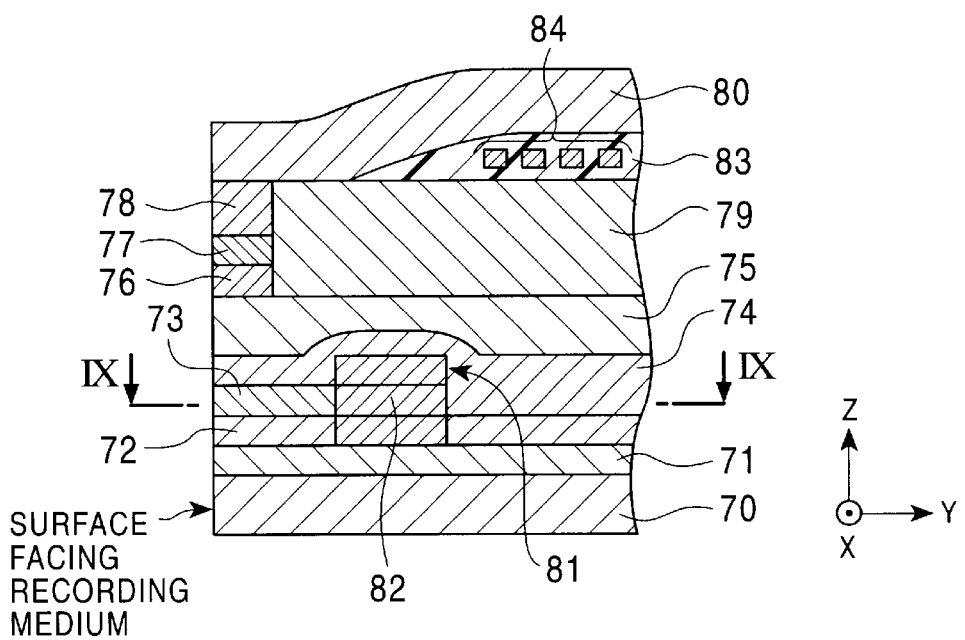
FIG. 8 is a partial longitudinal sectional view taken along the line VIII—VIII of FIG. 7.

FIG. 7 is a partial front view of a thin-film magnetic head including a magnetic sensing element in an embodiment of the present invention, viewed from the surface facing a recording medium. FIG. 8 is a partial longitudinal sectional view taken along the line VIII—VIII of FIG. 7. In FIGS. 7 and 8, the electrodes connected to the top and bottom of the magnetic sensing element are not shown.

In the present invention, the front end of the magnetic sensing element shown in any one of FIGS. 1 to 6 may be exposed at the surface facing the recording medium. Alternatively, as shown in FIG. 7 onward, the magnetic sensing element may recede in the height direction (in the Y direction in the drawing) so that the magnetic sensing element is not exposed at the surface facing the recording medium.

A lower shielding layer 70 shown in FIG. 7 is composed of a magnetic material, such as an NiFe alloy. Lower gap layers 71 and 72 are formed on the lower shielding layer 70. The lower gap layers 71 and 72 are composed of an insulating material, such as $Al_2O_3$ or $SiO_2$, or are partially composed of a nonmagnetic metal material, such as Ta, Cr, or Cu.

In this embodiment, a flux guide layer 73 is provided on the lower gap layer 72. The flux guide layer 73 is composed of a magnetic material, such as a CoFe alloy, an NiFe alloy, a CoFeNi alloy, or Co.

As shown in FIG. 8, a magnetic sensing element 81 according to any one of the embodiments shown in FIGS. 1 to 6 is formed on the lower gap layer 71 and recedes from the surface facing the recording medium in the height direction. Therefore, the front surface of the magnetic sensing element 81 is not exposed at the surface facing the recording medium.

In this embodiment, the flux guide layer 73 is formed integrally with the free magnetic layer 82 or is at least magnetically coupled to the free magnetic layer 82.

As shown in FIGS. 7 and 8, an upper gap layer 74 is formed over the flux guide 73, the magnetic sensing element 81, and the lower gap layer 72.

An upper shielding layer 75 composed of a magnetic material, such as an NiFe alloy, is formed on the upper gap layer 74.

In this embodiment, the upper shielding layer 75 also acts as a lower core layer of an inductive head for writing.

As shown in FIGS. 7 and 8, on the upper shielding layer (lower core layer) 75, a three-layered film including a lower magnetic pole layer 76, a gap layer 77, and an upper magnetic pole layer 78 is deposited. The three-layered film is exposed at the surface facing the recording medium.

The lower magnetic pole layer 76 and the upper magnetic pole layer 78 are composed of a magnetic material, such as an NiFe alloy. The gap layer 77 is composed of a nonmagnetic material, such as an NiP alloy. The gap layer 77 is preferably composed of a nonmagnetic metal material, and thereby the lower magnetic pole layer 76, the gap layer 77, and the upper magnetic pole layer 78 can be continuously formed by plating.

As shown in FIGS. 7 and 8, an insulting layer 79 composed of $Al_2O_3$ or $SiO_2$ is formed on the upper shielding layer 75 and in the periphery of the three-layered film, and the upper surface of the insulating layer 79 is flush with the upper surface of the upper magnetic pole layer 78.

Furthermore, as shown in FIG. 8, a coil layer 84 composed of Cu or the like is formed on the insulating layer 79, and the coil layer 84 is covered by an insulating layer 83 composed of an organic insulating material or the like.

An upper yoke layer 80 composed of an NiFe alloy or the like is formed over the upper magnetic pole layer 78 and the insulating layer 83. The upper yoke layer 80 is magnetically coupled to the upper shielding layer (lower core layer) 75 at the back in the height direction. As shown in FIG. 7, the width in the track width direction of the upper yoke layer 80 is larger than the width in the track width direction (track width Tw) of the upper magnetic pole layer 78.

As in the embodiment shown in FIGS. 7 and 8, when the flux guide layer 73 is at least magnetically coupled to the free magnetic layer 82 of the magnetic sensing element 81 and the flux guide layer 73 is exposed at the surface facing the recording medium, an external magnetic field is guided into the flux guide layer 73 and reaches the free magnetic layer 82.

Under the influence of the external magnetic field guided by the flux guide layer 73, the magnetization of the free magnetic layer 82 is varied, and electrical resistance changes due to the relationship between the varying magnetization of the free magnetic layer and the pinned magnetization of the pinned magnetic layer, and thus external signals are detected.

As shown in FIGS. 7 and 8, if the magnetic sensing element 81 recedes from the surface facing the recording medium and the flux guide layer 73 for guiding an external magnetic field to the free magnetic layer 82 is provided, at the surface facing the recording medium, the shielding layers 70 and 75 are opposed to each other with the gap layers 71, 72, and 74 and the flux guide layer 73 therebetween.

Consequently, even when a magnetic sensing element includes a larger number of layers compared to the dual spin-valve thin-film elements shown in FIGS. 1 and 3 and the dual spin-valve thin-film elements shown in FIGS. 4 to 6, it is possible to decrease the gap H1 between the shielding layers 70 and 75. Therefore, in accordance with the present invention, it is possible to provide a thin-film magnetic head which is suitable for gap narrowing as the recording densities increase.

As long as the flux guide layer 73 is magnetically coupled to the free magnetic layer 82, the flux guide layer 73 may be in contact with the free magnetic layer 82 or the flux guide layer 73 and the free magnetic layer 82 are placed with a slight distance therebetween.

Figure 10:
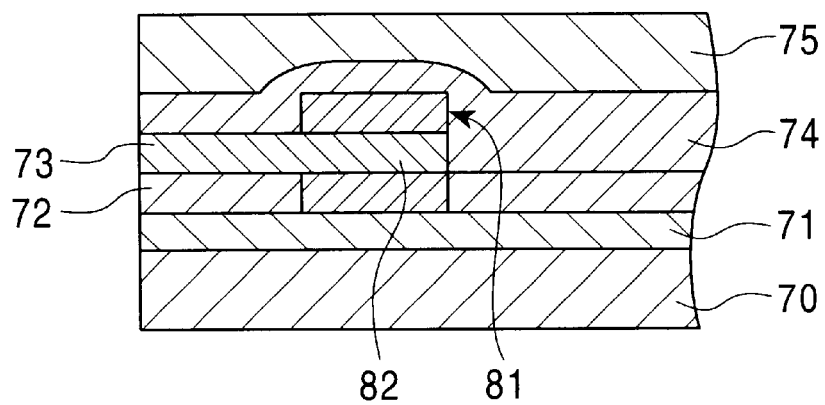
FIG. 10 is a partial sectional view of a thin-film magnetic head in another embodiment of the present invention.

As shown in FIG. 10, the flux guide layer 73 may be integrally formed with the free magnetic layer 82.

Figure 11:
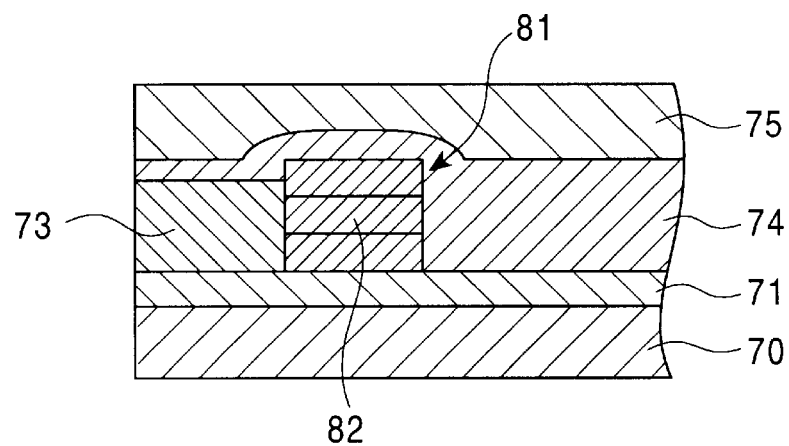
FIG. 11 is a partial sectional view of a thin-film magnetic head in another embodiment of the present invention.

Although the flux guide layer 73 is preferably magnetically coupled to the free magnetic layer 82 only, for example, as shown in FIG. 11, the flux guide layer 73 may be formed on the lower gap layer 71.

In such a case, the flux guide layer 73 faces the antiferromagnetic layers, pinned magnetic layers, etc., in addition to the free magnetic layer 82.

Figure 9:
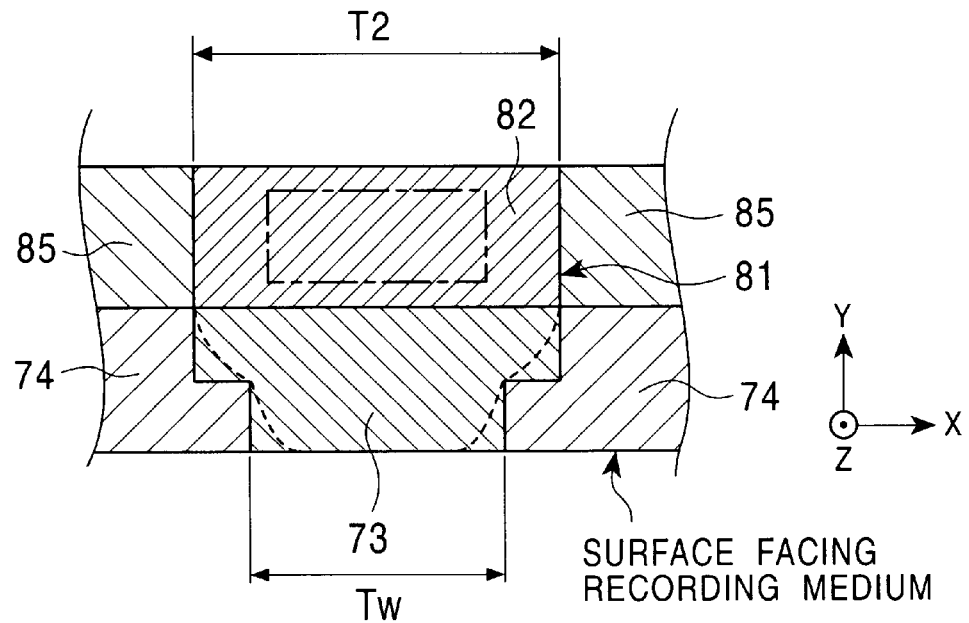
FIG. 9 is a sectional view taken along the line IX—IX of FIG. 8.

FIG. 9 is a partial sectional view taken along the line IX—IX of FIG. 8.

As shown in FIG. 9, the width (track width) Tw in the track width direction (in the X direction in the drawing) of the flux guide layer 73 at the surface facing the recording medium is preferably smaller than the width T2 in the track width direction of the magnetic sensing element 81.

In this embodiment, the width (track width) Tw of the flux guide layer 73 is defined as the track width.

As described above, by decreasing the width of the flux guide layer 73 to the track width Tw, the width T2 of the magnetic sensing element 81 can be larger than the track width Tw. Consequently, it is possible to form the magnetic sensing element 81 easily with an accuracy of commonly used photolithography.

As indicated by the chain line in FIG. 9, preferably, the insulating layers 35 described with reference to FIGS. 3 and 4 are formed outside the area surrounded by the chain line, and the second electrode layer 33 is formed so as to overlap the magnetic sensing element 81 exposed to the area surrounded by the chain line. Consequently, the sensing current from the second electrode layer 33 flows into the inside the area surrounded by the chain line, and the effective element size can be reduced.

The side faces of the flux guide layer 72 may be curved surfaces in which the width gradually increases from the surface facing the recording medium in the height direction as indicated by dotted lines in FIG. 9.

In the embodiment shown in FIG. 9, the longitudinal bias magnetic field from the hard bias layer 85 is applied to the free magnetic layer 82.

Figure 12:
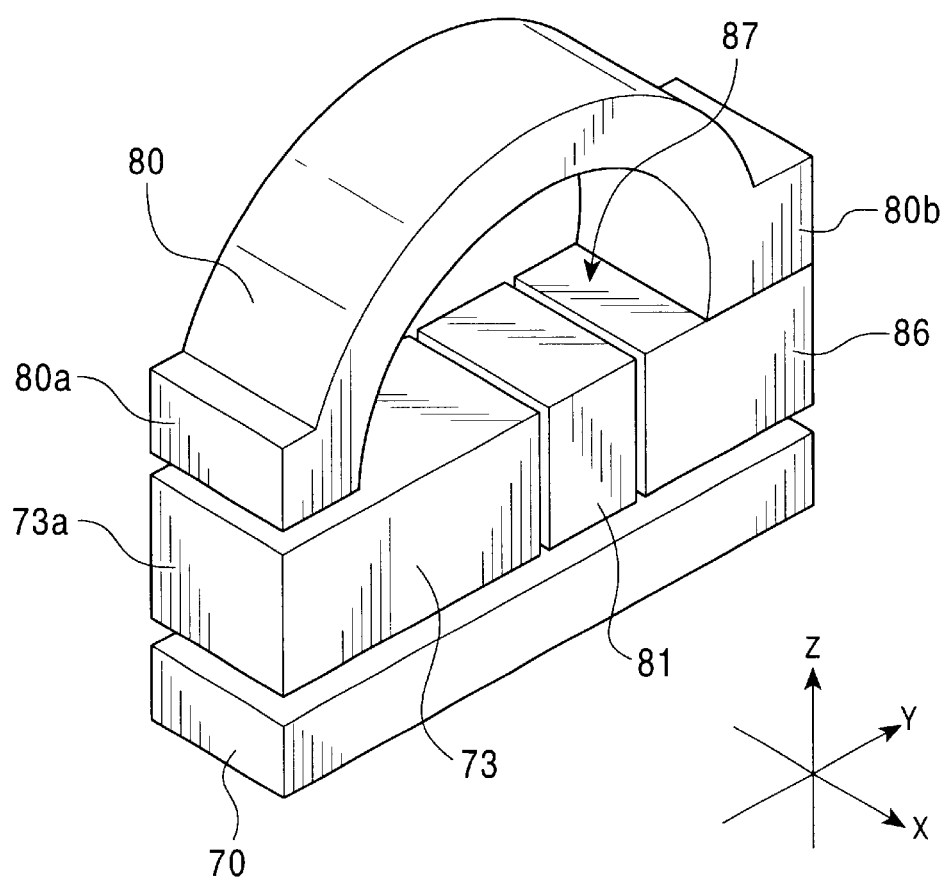
FIG. 12 is a partial perspective view of a thin-film magnetic head in another embodiment of the present invention.

FIG. 12 is a partial perspective view of a thin-film magnetic head in another embodiment of the present invention.

As shown in FIG. 12, the magnetic sensing element 81 recedes from the surface facing the recording medium in the height direction (in the Y direction in the drawing), and a flux guide layer 73 is provided in front of the magnetic sensing element 81. The flux guide layer 73 is magnetically coupled to the magnetic sensing element 81. The front end 73a of the flux guide layer 73 is exposed at the surface facing the recording medium.

In this embodiment, a back yoke layer 86 is provided at the back of the magnetic sensing element 81. The back yoke layer 86 is also magnetically coupled to the magnetic sensing element 81.

A lower shielding layer 70 is provided under the flux guide layer 73, the magnetic sensing element 81, and the back yoke layer 86 with a lower gap layer (not shown in the drawing) therebetween.

Furthermore, in this embodiment, an upper yoke layer 80 is opposed to the flux guide layer 73 from above with an upper gap layer (not shown) therebetween, the front end 80a of the upper yoke layer 80 is exposed at the surface facing the recording medium, and the base 80b of the upper yoke layer 80 is magnetically coupled to the back yoke layer 86. Additionally, when the upper yoke layer 80 is ring-shaped so as to form a small closed magnetic circuit (with a small magnetic coupling reluctance) as shown in FIG. 12, the magnetic head functions as a so-called "yoke-type" read head, and the gap between the front end 80a and the front end 73a corresponds to a read gap, and therefore it is possible to omit the lower shielding layer 70.

Although not shown in the drawing, a coil layer and an insulating layer for covering the coil layer may be formed in a space 87 surrounded by the upper yoke layer 80, the flux guide layer 73, the magnetic sensing element 81, and the back yoke layer 86. In such a case, the gap between the front end 80a and the front end 73a corresponds to the write gap as well as the read gap.

In this embodiment, the flux guide layer 73 is a guiding layer for guiding an external magnetic field to the free magnetic layer of the magnetic sensing element 81, and the magnetization of the free magnetic layer is varied under the influence of the external magnetic field guided from the flux guide layer 73. Electrical resistance changes due to the relationship between the varying magnetization of the free magnetic layer and the pinned magnetization of the pinned magnetic layer, and thus external signals are detected. Additionally, the upper yoke layer 80 may be considered to function as an upper shielding layer.

In this embodiment, the flux guide layer 73 may be used as a lower core layer of an inductive head for writing. That is, a magnetic circuit including the upper yoke layer 80, the back yoke layer 86, the magnetic sensing element 81, and the flux guide layer 73 is formed, and a recording magnetic field generated from the coil layer becomes a leakage magnetic field between the upper yoke layer 80 and the flux guide layer 73, and thus writing on the recording medium is performed.

As described above, in the embodiment shown in FIG. 12, since the flux guide layer 73 can be used as the lower core layer of the inductive head in addition to as the guiding layer for guiding the external magnetic field to the free magnetic layer, the number of layers in the thin-film magnetic head can be decreased, and the fabrication of the thin-film magnetic head can be simplified.

Figure 13:
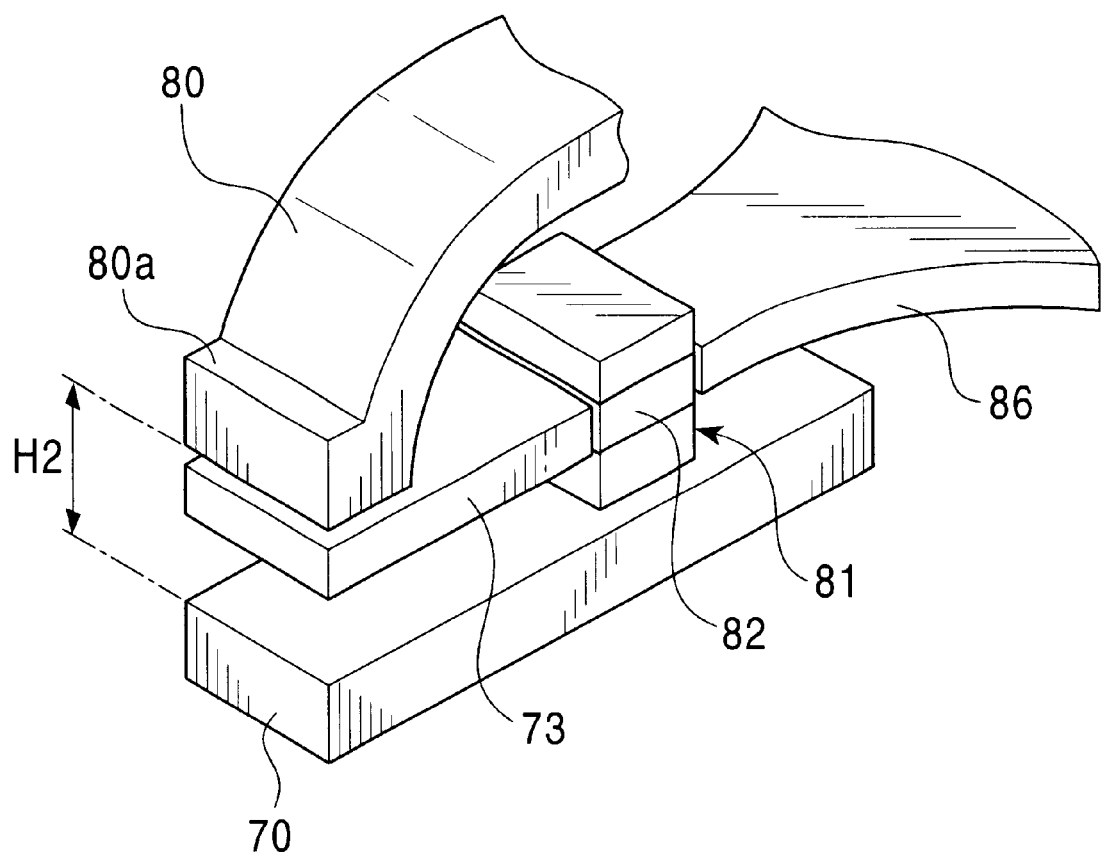
FIG. 13 is a partial perspective view of a thin-film magnetic head in another embodiment of the present invention.
Figure 14:
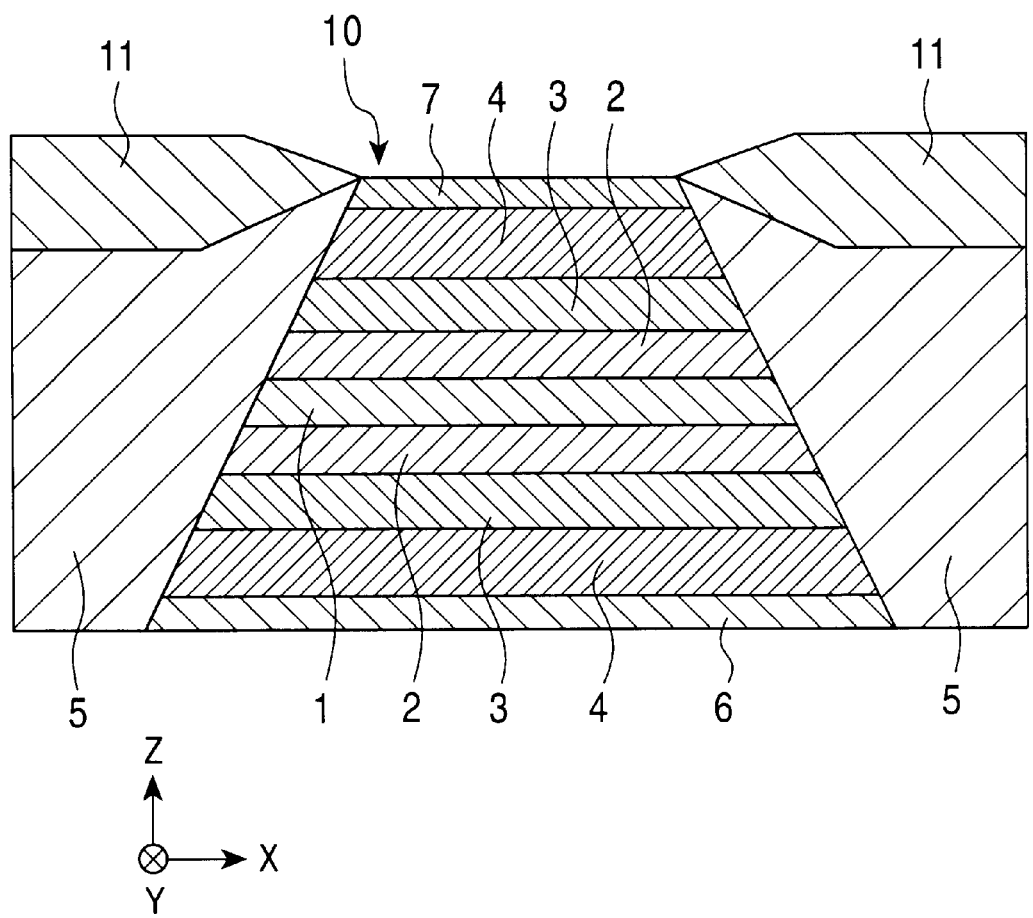
FIG. 14 is a partial sectional view of a conventional magnetic sensing element, viewed from the surface facing a recording medium.
Figure 15:
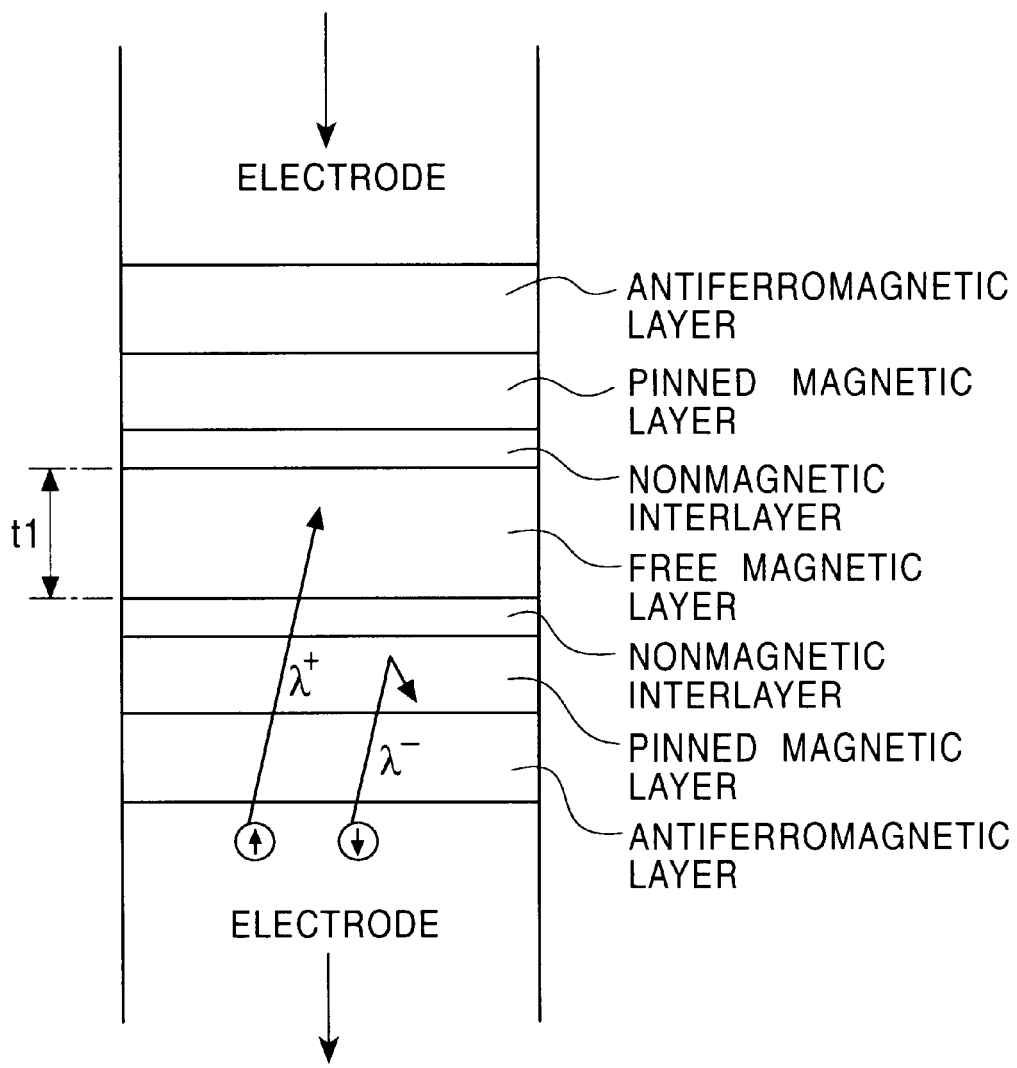
FIG. 15 is a partial schematic diagram showing the problem associated with the structure of a CPP-type dual spin-valve thin-film element.

Furthermore, as shown in FIG. 13, if the flux guide 73 is placed so as to face only the front end of the free magnetic layer 82 of the magnetic sensing element 81, the thickness of the flux guide layer 73 exposed at the surface facing the recording medium is decreased. Consequently, the gap H2 between the lower shielding layer 70 and the upper shielding layer 80 can be narrowed, and it is possible to provide a thin-film magnetic head which is suitable for gap narrowing as the recording densities increase. In such a case, the upper shielding layer 80 is not joined to the back yoke layer 86, and the upper shielding layer 80 does not act as a yoke layer for the inductive head.

Additionally, as shown in FIG. 10, the flux guide layer 73 may be formed integrally with the free magnetic layer 82. The back yoke layer 86 may be integrally formed with the free magnetic layer 82. Although the gaps which allow magnetic coupling are formed between the magnetic sensing element 81 and the flux guide layer 73 and between the magnetic sensing element 81 and the back yoke layer 86 in FIGS. 12 and 13, the magnetic sensing element 81 may be brought into contact with the flux guide layer 73 and with the back yoke layer 86. In such a case, by forming the back yoke layer so that the width increases toward back as shown in FIG. 13, demagnetizing fields can be decreased, and the read sensitivity can be improved.

Additionally, as in the case of the magnetic sensing elements shown in FIGS. 4 to 6, when two or more free magnetic layers are formed, a flux guide layer may be formed so as to face each of the free magnetic layers.

Additionally, magnetic sensing elements in accordance with the present invention can also be used for magnetic heads for tape recording and for magnetic sensors in addition to for thin-film magnetic heads mounted on hard disk drives.

What is claimed is:

1. A magnetic sensing element comprising a multilayer film comprising:

a free magnetic layer;

an upper nonmagnetic interlayer placed on the free magnetic layer;

a lower nonmagnetic interlayer placed under the free magnetic layer;

an upper pinned magnetic layer placed on the upper nonmagnetic interlayer;

a lower pinned magnetic layer placed under the lower nonmagnetic interlayer;

an upper antiferromagnetic layer placed on the upper pinned magnetic layer; and a lower antiferromagnetic layer placed under the lower pinned magnetic layer, each of the upper antiferromagnetic layer and the lower antiferromagnetic layer pinning a magnetization direction of each of the upper pinned magnetic layer and the lower pinned magnetic layer in a predetermined direction by an exchange coupling magnetic field, wherein a current flows perpendicular to planes of the individual layers of the multilayer film;

the free magnetic layer comprises at least two magnetic sublayers and an intermediate sublayer placed between the two magnetic sublayers; each of the upper pinned magnetic layer and the lower pinned magnetic layer comprises two magnetic sublayers and an intermediate sublayer placed therebetween; in the lower pinned magnetic layer, a magnetic moment of the magnetic sublayer in contact with the lower nonmagnetic interlayer is larger than a-magnetic moment of the magnetic sublayer in contact with the lower antiferromagnetic layer; and in the upper pinned magnetic layer, a magnetic moment of the magnetic sublayer in contact with the upper nonmagnetic interlayer is larger than a magnetic moment of the magnetic sublayer in contact with the upper antiferromagnetic layer.

2. A magnetic sensing element according to claim 1, wherein a thickness of the magnetic sublayer adjoining one of the upper nonmagnetic interlayer and the lower nonmagnetic interlayer is in the range of 40 Å to 100 Å.

3. A magnetic sensing element according to claim 1, wherein a number of said at least two magnetic sublayers is two, and a total thickness of the magnetic sublayers is in the range of 85 Å to 195 Å.

4. A magnetic sensing element according to claim 1, wherein a number of said at least two magnetic sublayers is two, and a resultant magnetic moment defined by a product of a saturation magnetization and thickness of the free magnetic layer is in the range of 5 T·Å to 60 T·Å.

5. A magnetic sensing element according to claim 4, wherein the resultant magnetic moment is at most 30 T·Å.

6. A magnetic sensing element according to claim 1, wherein the magnetic sensing element recedes from a surface facing a recording medium in a height direction, a flux guide layer extends from a front end of the free magnetic layer to a surface facing the recording medium, the flux guide layer one of being integrally formed with the free magnetic layer and being magnetically coupled to the free magnetic layer, and being exposed at the surface facing the recording medium.

7. A magnetic sensing element according to claim 6, wherein a width in a track width direction of the flux guide layer at the surface facing the recording medium is smaller than a width in the track width direction of the free magnetic layer.

8. A thin-film magnetic head comprising:
a magnetic sensing element according to claim 6;
an upper shielding layer provided on the flux guide layer with an upper gap layer therebetween; and
a lower shielding layer provided under the flux guide layer with a lower gap layer therebetween.

9. A thin-film magnetic head comprising:
a magnetic sensing element according to claim 7;
an upper shielding layer provided on the flux guide layer with an upper gap layer therebetween; and
a lower shielding layer provided under the flux guide layer with a lower gap layer therebetween.

10. A thin-film magnetic head according to claim 9, further comprising a back yoke layer provided on a surface opposite to the surface facing the recording medium, the back yoke layer one of being integrally formed with the free magnetic layer and being magnetically coupled to the free magnetic layer, and a base of the upper shielding layer is magnetically coupled to the back yoke layer.

11. A magnetic sensing element according to claim 1, wherein a thickness of the magnetic sublayer adjoining one of the upper nonmagnetic interlayer and the lower nonmagnetic interlayer is in the range of 40 Å to 100 Å; a number of said at least two magnetic sublayers is three, and the magnetic sublayer in contact with the upper nonmagnetic interlayer and the magnetic sublayer in contact with the lower nonmagnetic interlayer are magnetized in the same direction.

12. A magnetic sensing element according to claim 11, wherein a total thickness of the magnetic sublayers is in the range of 85 Å to 295 Å.

13. A magnetic sensing element according to claim 11, wherein a resultant magnetic moment of the free magnetic layer is in the range of 45 T·Å to 195 T·Å.

14. A magnetic sensing element according to claim 12, wherein a resultant magnetic moment of the free magnetic layer is in the range of 45 T·Å to 195 T·Å.

15. A magnetic sensing element comprising:
at least two multilayer films, each multilayer film comprising a free magnetic layer, an upper nonmagnetic interlayer placed on the free magnetic layer, a lower nonmagnetic interlayer placed under the free magnetic layer, an upper pinned magnetic layer placed on the upper nonmagnetic interlayer, and a lower pinned magnetic layer placed under the lower nonmagnetic interlayer;
an intermediate antiferromagnetic layer placed between the two multilayer films;
a lower antiferromagnetic layer placed under a lower surface of the multilayer film located at a bottom of the magnetic sensing element; and
an upper antiferromagnetic layer placed on an upper surface of the multilayer film located on a top of the magnetic sensing element,
wherein a magnetization direction of each of the upper pinned magnetic layer and the lower pinned magnetic layer is pinned in a predetermined direction by an exchange coupling magnetic field generated between the pinned magnetic layer and any one of the intermediate antiferromagnetic layer, the lower antiferromagnetic layer, and the upper antiferromagnetic layer, and a current flows perpendicular to planes of the individual layers each of the upper pinned magnetic layer and the lower pinned magnetic layer comprises two magnetic sublayers and an intermediate sublayer placed therebetween; in the lower pinned magnetic layer, a magnetic moment of the magnetic sublayer in contact with the lower nonmagnetic interlayer is larger than a magnetic moment of the magnetic sublayer in contact with the lower antiferromagnetic layer; and in the upper pinned magnetic layer, a magnetic moment of the magnetic sublayer in contact with the upper nonmagnetic interlayer is larger than a magnetic moment of the magnetic sublayer in contact with the upper antiferromagnetic layer.

16. A magnetic sensing element according to claim 15, wherein the free magnetic layer comprises at least two magnetic sublayers and an intermediate sublayer placed between the two magnetic sublayers.

17. A magnetic sensing element according to claim 10, wherein a thickness of the magnetic sublayer in contact with one of the upper nonmagnetic interlayer and the lower nonmagnetic interlayer is in the range of 40 Å to 100 Å.

18. A magnetic sensing element according to claim 16, wherein a number of said at least two magnetic sublayers is two, and a total thickness of the magnetic sublayers is in the range of 85 Å to 195 Å.

19. A magnetic sensing element according to claim 16, wherein a number of said at least two magnetic sublayers is two, and a resultant magnetic moment defined by a product of a saturation magnetization and thickness of the free magnetic layer is in the range of 5 T·Å to 60 T·Å.

20. A magnetic sensing element according to claim 19, wherein the resultant magnetic moment is at most 30 T·Å.

21. A magnetic sensing element according to claim 16, wherein a thickness of the magnetic sublayer in contact with one of the upper nonmagnetic interlayer and the lower nonmagnetic interlayer is in the range of 40 Å to 100 Å; a number of said at least two magnetic sublayers is three, and the magnetic sublayer in contact with the upper nonmagnetic interlayer and the magnetic sublayer in contact with the lower nonmagnetic interlayer are magnetized in the same direction.

22. A magnetic sensing element according to claim 21, wherein a resultant magnetic moment of the free magnetic layer is in the range of 45 T·Å to 195 T·Å.

23. A magnetic sensing element according to claim 21, wherein a total thickness of the magnetic sublayers is in the range of 85 Å to 295 Å.

24. A magnetic sensing element according to claim 23, resultant magnetic moment of the free magnetic layer is in the range of 45 T·Å to 195 T·Å.

25. A magnetic sensing element according to claim 15, wherein the magnetic sensing element recedes from a surface facing a recording medium in a height direction, a flux guide layer extends from a front end of the free magnetic layer to a surface facing the recording medium, the flux guide layer one of being integrally formed with the free magnetic layer and being magnetically coupled to the free magnetic layer, and being exposed at the surface facing the recording medium.

26. A thin-film magnetic head comprising:

a magnetic sensing element according to claim 25;

an upper shielding layer provided on the flux guide layer with an upper gap layer therebetween; and a lower shielding layer provided under the flux guide layer with a lower gap layer therebetween.

27. A magnetic sensing element according to claim 25, wherein a width in a track width direction of the flux guide layer at the surface facing the recording medium is smaller than a width in the track width direction of the free magnetic layer.

28. A thin-film magnetic head comprising:

a magnetic sensing element according to claim 27;

an upper shielding layer provided on the flux guide layer with an upper gap layer therebetween; and a lower shielding layer provided under the flux guide layer with a lower gap layer therebetween.

29. A thin-film magnetic head according to claim 28, further comprising a back yoke layer provided on a surface opposite to the surface facing the recording medium, the back yoke layer one of being integrally formed with the free magnetic layer and being magnetically coupled to the free magnetic layer, and a base of the upper shielding layer is magnetically coupled to the back yoke layer.

* * * * *